(12) United States Patent
Lu

(10) Patent No.: US 11,056,446 B2
(45) Date of Patent: Jul. 6, 2021

(54) SEMICONDUCTOR PACKAGE DEVICE AND SEMICONDUCTOR PROCESS

(71) Applicant: Advanced Semiconductor Engineering, Inc., Kaohsiung (TW)

(72) Inventor: Wen-Long Lu, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 0 days.

(21) Appl. No.: 16/547,539

(22) Filed: Aug. 21, 2019

(65) Prior Publication Data

US 2021/0057356 A1 Feb. 25, 2021

(51) Int. Cl.
| | |
|---|---|
| H01L 23/00 | (2006.01) |
| H01L 23/29 | (2006.01) |
| H01L 23/498 | (2006.01) |
| H01L 21/48 | (2006.01) |
| H01L 21/56 | (2006.01) |
| H01L 23/31 | (2006.01) |

(52) U.S. Cl.
CPC ........ *H01L 23/564* (2013.01); *H01L 21/4853* (2013.01); *H01L 21/566* (2013.01); *H01L 23/295* (2013.01); *H01L 23/3128* (2013.01); *H01L 23/49838* (2013.01); *H01L 24/16* (2013.01); *H01L 2224/16227* (2013.01)

(58) Field of Classification Search
CPC . H01L 21/565; H01L 23/564; H01L 23/3128; H01L 23/49838; H01L 24/16; H01L 23/295; H01L 21/566; H01L 2224/16227; H01L 21/4853; H01L 24/13; H01L 24/17; H05K 3/3436
See application file for complete search history.

(56) References Cited

U.S. PATENT DOCUMENTS

| | | | |
|---|---|---|---|
| 10,283,377 B1* | 5/2019 | Chen | ............. H01L 23/3135 |
| 2007/0212802 A1* | 9/2007 | Lee | .................. H01L 33/54 |
| | | | 438/22 |

* cited by examiner

*Primary Examiner* — Jasmine J Clark
(74) *Attorney, Agent, or Firm* — Foley & Lardner LLP

(57) ABSTRACT

A semiconductor package device includes a wiring structure, a semiconductor chip and an encapsulant. The semiconductor chip is electrically connected to the wiring structure. The encapsulant is disposed on the wiring structure and covers the semiconductor chip. A roughness (Ra) of a surface of the encapsulant is about 5 nm to about 50 nm.

22 Claims, 26 Drawing Sheets

SEMICONDUCTOR PACKAGE DEVICE AND SEMICONDUCTOR PROCESS

BACKGROUND

1. Field of the Disclosure

The present disclosure relates to a semiconductor package device and a semiconductor process, and to a semiconductor package device having a water-repellent surface, and a semiconductor process for manufacturing at least a portion of the semiconductor package device.

2. Description of the Related Art

In a semiconductor package device, a semiconductor chip is disposed on a wiring structure. Then, an encapsulant is formed on the wiring structure to cover the semiconductor chip. The encapsulant may protect the semiconductor chip from moisture in the environment. However, the encapsulant may have some micro cracks. Moisture may adhere to surfaces of the encapsulant, and infiltrate along the micro cracks into the encapsulant.

SUMMARY

In some embodiments, a semiconductor package device includes a wiring structure, a semiconductor chip and an encapsulant. The semiconductor chip is electrically connected to the wiring structure. The encapsulant is disposed on the wiring structure and covers the semiconductor chip. A roughness (Ra) of a surface of the encapsulant is about 5 nm to about 50 nm.

In some embodiments, a semiconductor package device includes a wiring structure, a semiconductor chip and a hydrophobic layer. The semiconductor chip is electrically connected to the wiring structure. The hydrophobic layer is disposed on a bottom surface of the wiring structure.

In some embodiments, a semiconductor process includes (a) providing a mold chase having an inner surface defining a cavity; (b) disposing a sacrificial layer on the inner surface of the mold chase, wherein a roughness (Ra) of the sacrificial layer is about 5 nm to about 50 nm; (c) disposing an encapsulant in the cavity of the mold chase to contact the sacrificial layer; (d) providing a wiring structure with a semiconductor chip electrically connected thereon; (e) disposing the wiring structure on the mold chase, such that the semiconductor chip is accommodated in the cavity of the mold chase and covered by the encapsulant; and (f) removing the mold chase and the sacrificial layer.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
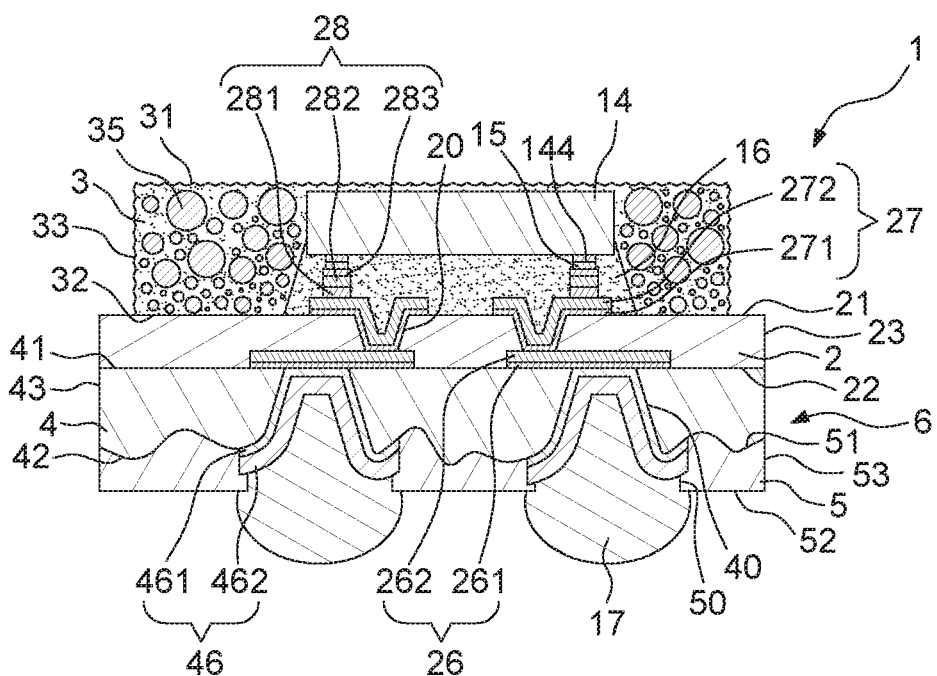
FIG. 1 illustrates a cross-sectional view of an example of a semiconductor package device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In a semiconductor package device, a semiconductor chip is disposed on a wiring structure. The semiconductor chip may be electrically connected to the wiring structure through solders and bumps. Then, an encapsulant is formed on the wiring structure to cover the semiconductor chip. The encapsulant may protect the semiconductor chip from moisture in the environment. However, the encapsulant may have some micro cracks. Besides, small gaps may occur between the encapsulant and the wiring structure. Moisture may adhere to surfaces of the encapsulant, and infiltrate along the micro cracks and the small gaps into the encapsulant.

In addition, the wiring structure may include several insulation layers and circuit layers, and an under bump metallization extending through a bottom insulation layer and exposed on the bottom surface of the wiring structure. Small gaps may occur between the under bump metallization and the bottom insulation layer. Small gaps may further occur between each of the insulation layers, and exposed from a lateral surface of the wiring structure. Moisture may also adhere to the bottom surface and the lateral surface of the wiring structure, and infiltrate along these gaps to reach the circuit layers of the wiring structure.

Moisture infiltrated into the semiconductor package may result in voids during subsequent thermal processes, erosion of the circuit layers of the wiring structure, and intermetallic compound of the solders and bumps between the semiconductor chip and the wiring structure. These may reduce service life of the semiconductor package device.

The present disclosure addresses at least some of the above concerns and provides for an improved semiconductor package device. The semiconductor package device has a water-repellent surface, which surface is provided with reduced adhesion of water. Accordingly, moisture may not adhere to the surface of the semiconductor package device. Some embodiments of the present disclosure further provides for a semiconductor process for manufacturing at least a portion of the semiconductor package device.

FIG. 1 illustrates a cross-sectional view of a semiconductor package device 1 according to some embodiments of the present disclosure. The semiconductor package device 1 includes a wirings structure 6, a hydrophobic layer 5, a connecting element 17, a semiconductor chip 14 and an encapsulant 3.

As shown in FIG. 1, the wiring structure 6 may include a first insulation layer 2, a first circuit layer 26, a second insulation layer 4, an under bump metallization (UBM) 46 and a second circuit layer 27. However, the term "wiring structure" may refer to some of them. The first insulation layer 2 has a first surface 21, a second surface 22 opposite to the first surface 21, and a lateral surface 23 extending between the first surface 21 and the second surface 22. As shown in FIG. 1, the first surface 21 may be a top surface, and the second surface 22 may be a bottom surface. The first insulation layer 2 defines an opening 20 extending through the first insulation layer 2. A material of the first insulation layer 2 may include an insulating material, a passivation material, a dielectric material or a solder resist material, such as, for example, a benzocyclobutene (BCB) based polymer or a polyimide (PI).

The first circuit layer 26 is disposed adjacent to the second surface 22 of the first insulation layer 2. The first circuit layer 26 is in contact with the first insulation layer 2. For example, the circuit layer 26 is embedded in the first insulation layer 2 and exposed from the second surface 22 of the first insulation layer 2. The first circuit layer 26 may include a seed layer 261 and a conductive layer 262. A bottom surface of the seed layer 261 may be substantially coplanar with the second surface 22 of the first insulation layer 2, and may be exposed from the second surface 22 of the first insulation layer 2. The conductive layer 262 is disposed on the seed layer 261. A portion of the first circuit layer 26, such as the conductive layer 262, is exposed in the opening 20 of the first insulation layer 2. A material of the seed layer 261 may be titanium, copper, another metal or an alloy. In some embodiments, the seed layer 261 includes a titanium layer and a copper layer. A material of the conductive layer 262 may include, for example, copper, another conductive metal, or an alloy thereof.

The second insulation layer 4 is disposed on the first insulation layer 2 and covers the first circuit layer 26. For example, the second insulation layer 4 is disposed on and contacts the second surface 22 of the first insulation layer 2. The second insulation layer 4 has a first surface 41, a second surface 42 opposite to the first surface 41, and a lateral surface 43 extending between the first surface 41 and the second surface 42. As shown in FIG. 1, the first surface 41 may be a top surface, and the second surface 42 may be a bottom surface. The second surface 42 may be roughened. For example, a roughness (Ra) of the second surface 42 may be greater than about 250 nm. Such a large roughness may improve binding strength between the second insulation layer 4 and a layer disposed on the second surface 42 of the second insulation layer 4, such as the hydrophobic layer 5. The second insulation layer 4 defines an opening 40 extending through the second insulation layer 4 to expose a portion of the first circuit layer 26, such as the seed layer 261 of the first circuit layer 26. A material of the second insulation layer 4 may include an insulating material, a passivation material, a dielectric material or a solder resist material, such as, for example, a benzocyclobutene (BCB) based polymer or a polyimide (PI). The material of the second insulation layer 4 may be the same as or different from the material of the first insulation layer 2.

As shown in FIG. 1, the first surface 21 of the first insulation layer 2 may be a top surface of the wiring structure 6, the second surface 42 of the second insulation layer 4 may be a bottom surface of the wiring structure 6. In addition, the lateral surface 23 of the first insulation layer 2 and the lateral surface 43 of the second insulation layer 4 may be substantially coplanar with each other, and may jointly be a lateral surface of the wiring structure 6.

The UBM 46 is disposed adjacent to the bottom surface of the wiring structure 6, such as the second surface 42 of the second insulation layer 4. As shown in FIG. 1, the UBM 46 is disposed in the opening 40 of the second insulation layer 4 to contact the first circuit layer 26. A portion of the UBM 46 extends on and is conformal to the second surface 42 of the second insulation layer 4. In some embodiments, the UBM 46 also includes a seed layer 461 and a conductive layer 462. The seed layer 461 is disposed on and contacts the second insulation layer 4, and the conductive layer 462 is disposed on and covers the seed layer 461. A material of the seed layer 461 may be titanium, copper, another metal or an alloy. In some embodiments, the seed layer 461 includes a titanium layer and a copper layer. A material of the conductive layer 462 may include, for example, copper, another conductive metal, or an alloy thereof. However, in other embodiments, the UBM 46 may further include a barrier layer, a wetting layer, etc.

The hydrophobic layer 5 is disposed on the bottom surface of the wiring structure 6, such as the bottom surface 42 of the second insulation layer 4, and covers at least a portion of the UBM 46. The hydrophobic layer 5 has a first surface 51, a second surface 52 opposite to the first surface 51, and a lateral surface 53 extending between the first surface 51 and the second surface 52. As shown in FIG. 1, the first surface 51 may be a top surface, and the second surface 52 may be a bottom surface. The first surface 51 of the hydrophobic layer 5 contacts and is conformal to the bottom surface 42 of the second insulation layer 4. The lateral surface 53 of the hydrophobic layer 5 may be substantially coplanar with the lateral surface 23 of the first insulation layer 2 and/or the lateral surface 43 of the second insulation layer 4. The hydrophobic layer 5 is made of a hydrophobic material, preferably of a superhydrophobic material. For example, a water contact angle of the hydrophobic layer 5 is about 150° to about 180°. A roughness (Ra) of the second surface 52 of the hydrophobic layer 5 is less than a roughness (Ra) of the second surface 42 of the second insulation layer 4. The hydrophobic layer 5 defines an opening 50 to expose the UBM 46. The connecting element 17 (e.g., a solder bump) is disposed in the opening 50 and on the UBM 46 for external connection purpose.

The second circuit layer 27 is disposed on the first surface 21 of the first insulation layer 2, and extends in the opening 20 to connect the first circuit layer 26. The second circuit layer 27 also includes a seed layer 271 and a conductive layer 272. The seed layer 271 is disposed on and contacts the first insulation layer 2, and the conductive layer 272 is disposed on and covers the seed layer 271. A material of the seed layer 271 may be titanium, copper, another metal or an alloy. In some embodiments, the seed layer 271 includes a titanium layer and a copper layer. A material of the conductive layer 272 may include, for example, copper, another conductive metal, or an alloy thereof. A plurality of conductive pillars 28 are disposed on and electrically connected to the second circuit layer 27. In some embodiments, each of the conductive pillars 28 includes a first section 281, a second section 282 and a third section 283 sequentially disposed on the second circuit layer 27. The first second 281, the second section 282 and the third section 283 may be made of copper, nickel and gold, respectively.

The semiconductor chip 14 is electrically connected to the wiring structure 6. For example, the semiconductor chip 14 is disposed on the first insulation layer 2 and electrically connected to the second circuit layer 27. The semiconductor chip 14 may include a plurality of bumps 144 disposed adjacent to an active surface thereof. The bumps 144 are electrically connected to the conductive pillars 28 through a plurality of solders 15. Thus, the semiconductor chip 14 is attached to the wiring structure 6 by a flip-chip bonding. An underfill 16 is disposed between the semiconductor chip 14 and the first insulation layer 2, and covers the second circuit layer 27, the conductive pillars 28, the solders 15 and the bumps 144 of the semiconductor chip 14.

The encapsulant 3 is disposed on the wiring structure 6 and covers the semiconductor chip 14. The encapsulant 3 has a first surface 31, a second surface 32 opposite to the first surface 31, and a lateral surface 33 extending between the first surface 31 and the second surface 32. The second surface 32 is disposed on and contacts the first surface 21 of the first insulation layer 2. The lateral surface 33 of the encapsulant 3 is not coplanar with (e.g., is inwardly recessed from or otherwise displaced from) the lateral surface of the wiring structure 6 (e.g., the lateral surface 23 of the first insulation layer 2 and the lateral surface 43 of the second insulation layer 4). A roughness (Ra) of the first surface 31 and the lateral surface 33 of the encapsulant 3 is about 5 nm to about 50 nm. That is, the first surface 31 and the lateral surface 33 are nanostructured surfaces. In some embodiments, as shown in FIG. 1, the encapsulant 3 may be a molding compound, such as an epoxy resin, and may include fillers 35. However, in other embodiments, the encapsulant 3 may be a molding compound without fillers.

In the semiconductor package device 1, since the roughness (Ra) of the first surface 31 and the lateral surface 33 of the encapsulant is about 5 nm to about 50 nm, adhesion of water to the encapsulant 3 can be minimized. That is, moisture may be prohibited from adhering to the first surface 31 and the lateral surface 33 of the encapsulant 3. Hence, moisture may not infiltrate along micro cracks into the encapsulant 3.

Besides, due to the arrangement of the hydrophobic layer 5, moisture is prohibited from adhering to the second surface 52 and the lateral surface 53 of the hydrophobic layer 5. That is, moisture cannot infiltrate along small gaps between the UBM 46 and the second insulation layer 4. Accordingly, failure of the semiconductor package device 1 can be prevented, and service life of the semiconductor package device 1 can be prolonged.

Figure 2:
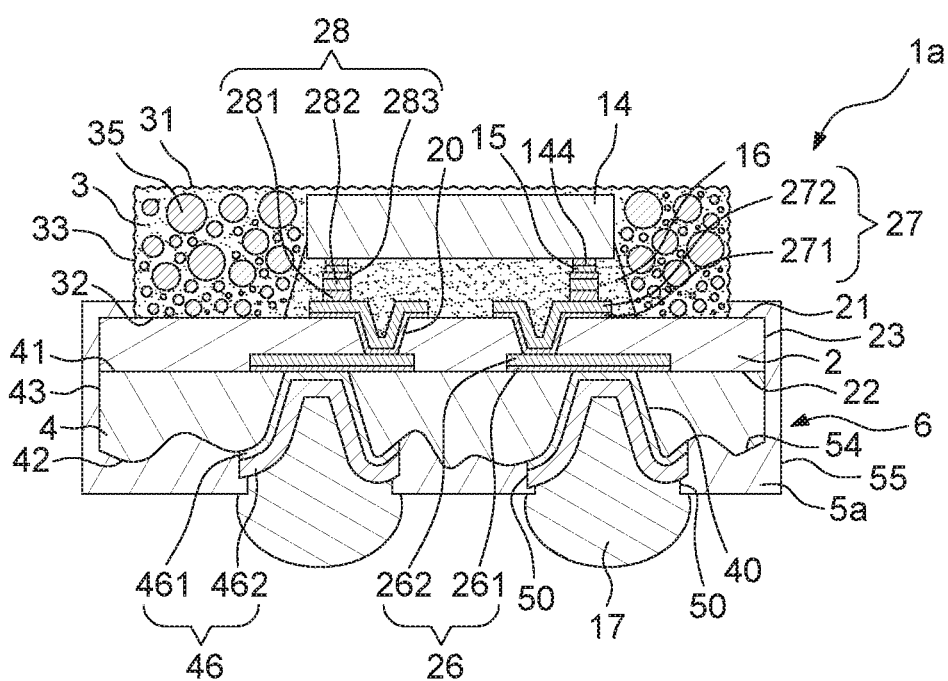
FIG. 2 illustrates a cross-sectional view of an example of a semiconductor package device according to some embodiments of the present disclosure.

FIG. 2 illustrates a cross-sectional view of a semiconductor package device 1a according to some embodiments of the present disclosure. The semiconductor package device 1a is similar to the semiconductor package device 1 shown in FIG. 1, except for the hydrophobic layer 5a.

As shown in FIG. 2, the hydrophobic layer 5a is further disposed on the lateral surface of the wiring structure 6, such as the lateral surface 23 of the first insulation layer 2 and the lateral surface 43 of the second insulation layer 4. Besides, the hydrophobic layer 5a is further disposed on the top surface of the wiring structure 6, such as the first surface 21 of the first insulation layer 2. For example, the hydrophobic layer 5a has an inner surface 54 and an outer surface 55. The inner surface 54 contacts and is conformal to the second surface 42 and the lateral surface 43 of the second insulation layer 4, and the first surface 21 and the lateral surface 23 of the first insulation layer 2. The outer surface 55 is exposed to air.

Since the hydrophobic layer 5a covers the entire lateral surface of the wiring structure 6, moisture is prohibited from infiltrating into small gaps between the first insulation layer 2 and the second insulation layer 4. Hence, the first circuit layer 26 can be protected from moisture. Besides, since the hydrophobic layer 5a is further disposed on the top surface of the wiring structure 6, small gaps between the encapsulant 3 and the first insulation layer 2 may be blocked by the hydrophobic layer 5a. Accordingly, moisture is prohibited from infiltrating into the encapsulant 3.

Figure 3:
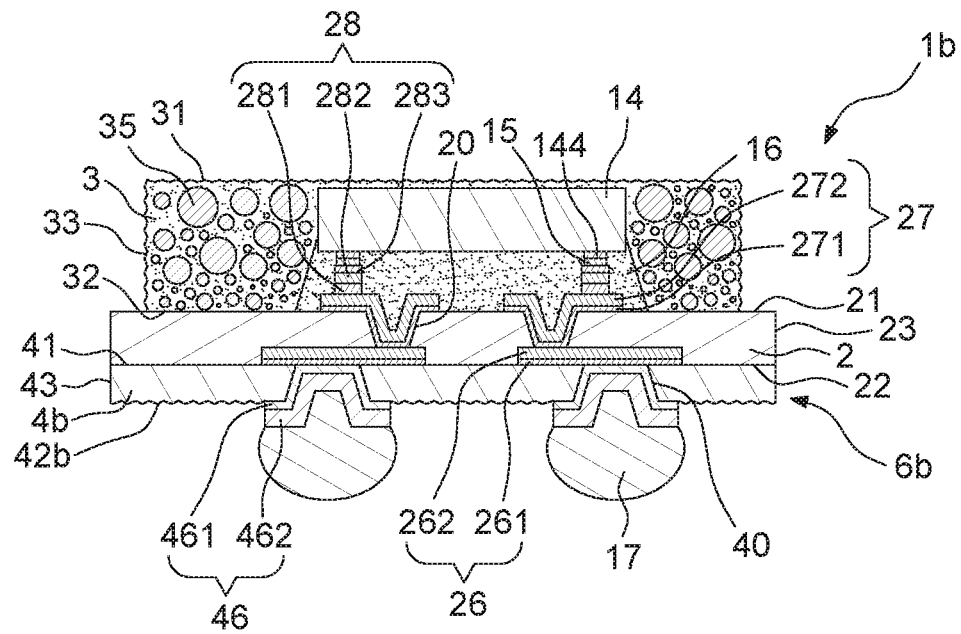
FIG. 3 illustrates a cross-sectional view of an example of a semiconductor package device according to some embodiments of the present disclosure.

FIG. 3 illustrates a cross-sectional view of a semiconductor package device 1b according to some embodiments of the present disclosure. The semiconductor package device 1b is similar to the semiconductor package device 1 shown in FIG. 1, except for the follows.

In the semiconductor package device 1b, the hydrophobic layer 5 is omitted. A roughness (Ra) of a bottom surface 42b of the second insulation layer 4b is about 5 nm to about 50 nm. That is, a roughness (Ra) of a bottom surface of the wiring structure 6b is about 5 nm to about 50 nm. Since bottom surface 42b of the second insulation layer 4b is a nanostructured surface, moisture is prohibited from adhering to the bottom surface 42b of the second insulation layer 4b.

Figure 4:
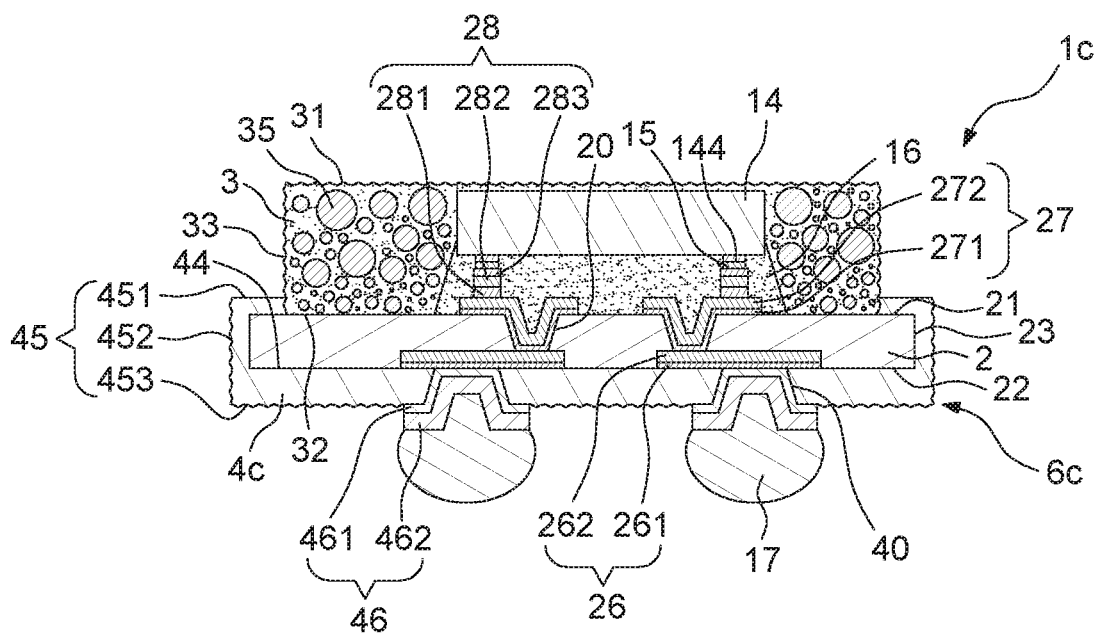
FIG. 4 illustrates a cross-sectional view of an example of a semiconductor package device according to some embodiments of the present disclosure.

FIG. 4 illustrates a cross-sectional view of a semiconductor package device 1c according to some embodiments of the present disclosure. The semiconductor package device 1c is similar to the semiconductor package device 1b shown in FIG. 3, except for the follows.

The second insulation layer 4c is disposed on a bottom surface 22 and a lateral surface 23 of the first insulation layer 2. Besides, the second insulation 4c layer is further disposed on the top surface 21 of the first insulation layer 2, and contacts the encapsulant 3.

As shown in FIG. 4, the second insulation layer 4c has an inner surface 44 and an outer surface 45. The inner surface 44 is disposed on and contacts the second surface 22, the lateral surface 23 and the first surface 21 of the first insulation layer 2. The outer surface 45 is exposed to air, and has an upper portion 451, a lateral portion 452 and a lower portion 453. The upper portion 451, the lateral portion 452 and the lower portion 453 of the outer surface 45 of the second insulation layer 4b can be viewed as a top surface, a lateral surface and a bottom surface of the second insulation layer 4c, respectively. A roughness (Ra) of the lateral portion 452 and the lower portion 453 of the outer surface 45 of the second insulation layer 4b is about 5 nm to about 50 nm. That is, a roughness (Ra) of a lateral surface and a bottom surface of the wiring structure 6c is about 5 nm to about 50 nm. However, a roughness (Ra) of a top surface of the wirings structure 6c, e.g., the upper portion 451 of the outer surface 45 of the second insulation layer 4b, may not be about 5 nm to about 50 nm.

FIG. 5 through FIG. 23 illustrate a semiconductor process according to some embodiments of the present disclosure. In some embodiments, the semiconductor process is for manufacturing a semiconductor package device, such as the semiconductor package device 1 shown in FIG. 1.

Figure 5:
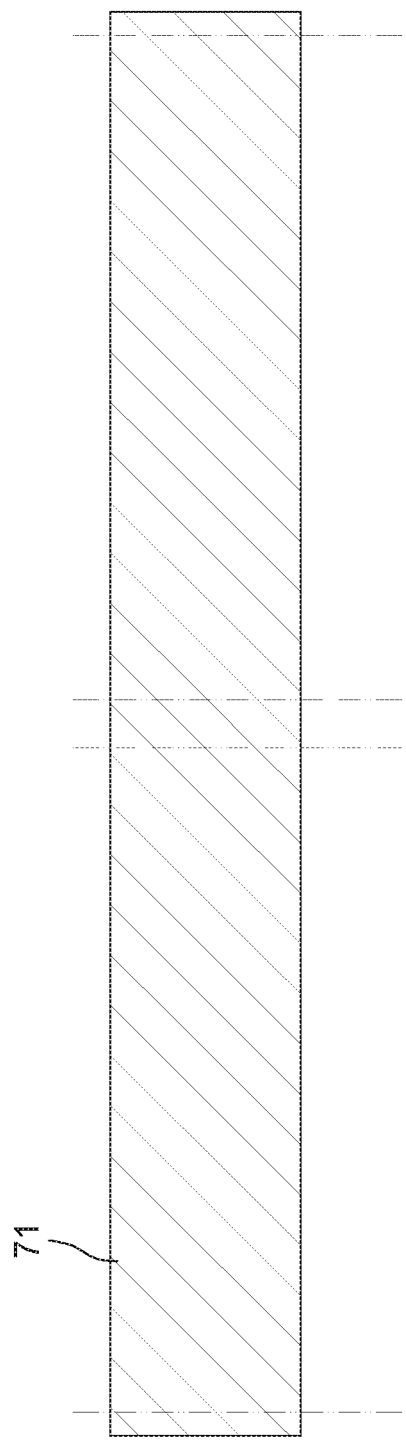
FIG. 5 illustrates one or more stages of an example of a semiconductor process according to some embodiments of the present disclosure.

Referring to FIG. 5, a mold bulk 71 is provided. The mold bulk 71 may be made of a photoimageable material.

Figure 6:
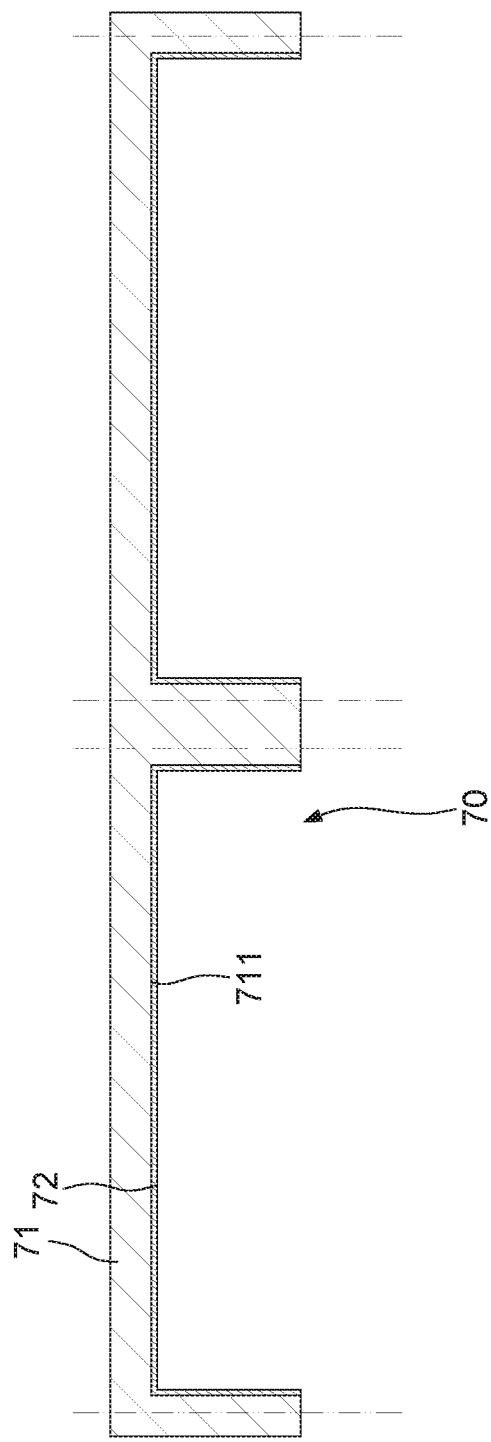
FIG. 6 illustrates one or more stages of an example of a semiconductor process according to some embodiments of the present disclosure.

Referring to FIG. 6, at least one cavity 70 is formed on the mold bulk 71, thus forming the mold bulk 71 into a mold chase 71. As shown in FIG. 6, the mold chase 71 includes two cavities 70. In other embodiments, the mold chase 71 may include more than two cavities 70. The cavity 70 may be formed by lithography techniques. The mold chase 71 has an inner surface 711 defining the cavity 70. Then, a seed layer 72 is formed on the inner surface 711 of the mold chase 71. The seed layer 72 may be made of titanium, copper, another metal or an alloy. In some embodiments, the seed layer 72 includes a titanium layer and a copper layer.

Figure 7:
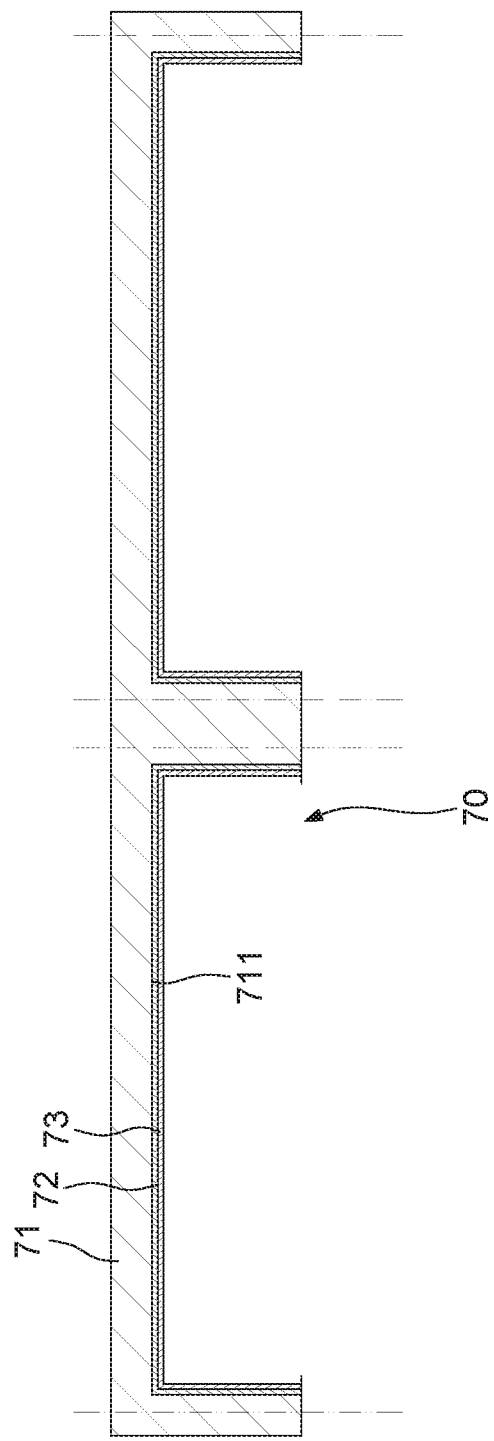
FIG. 7 illustrates one or more stages of an example of a semiconductor process according to some embodiments of the present disclosure.

Referring to FIG. 7, a metal layer 73 is disposed on and covers the seed layer 72. The metal layer 73 may be made of copper, another metal or an alloy, and may be formed by plating.

Figure 8:
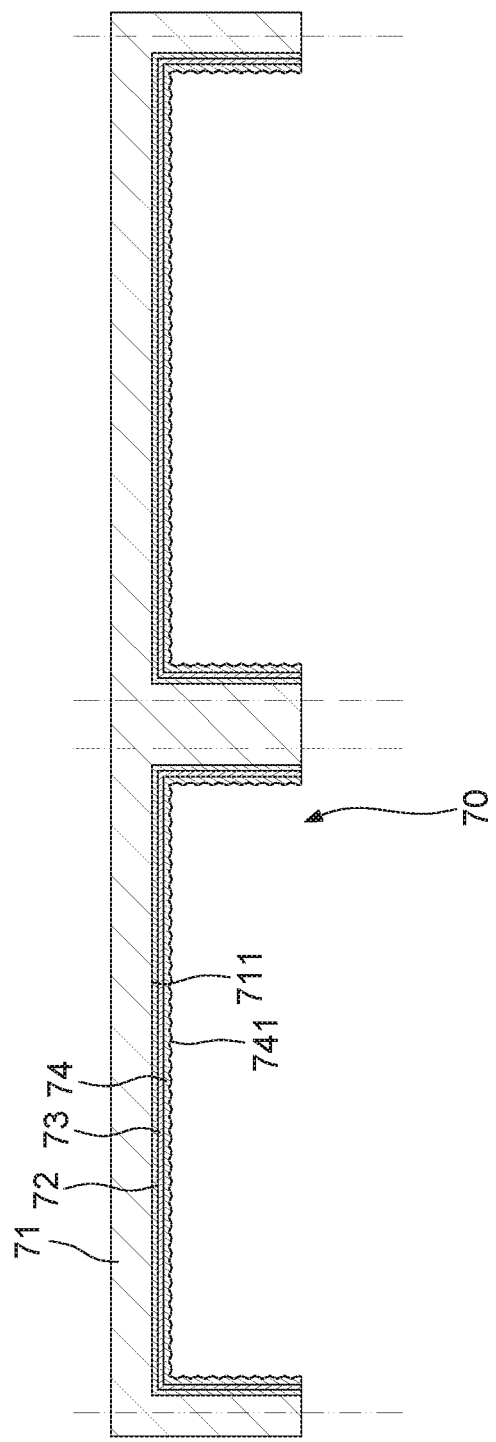
FIG. 8 illustrates one or more stages of an example of a semiconductor process according to some embodiments of the present disclosure.

Referring to FIG. 8, a sacrificial layer 74 is disposed on the inner surface 711 of the mold chase 71, and on the seed layer 72 and the metal layer 73. A roughness (Ra) of an inner surface 741 of the sacrificial layer 74 may be about 5 nm to 50 nm. The sacrificial layer 74 may be a layer of graphene, graphene oxide, copper, copper oxide or zinc oxide form by physical vapor deposition.

Figure 9:
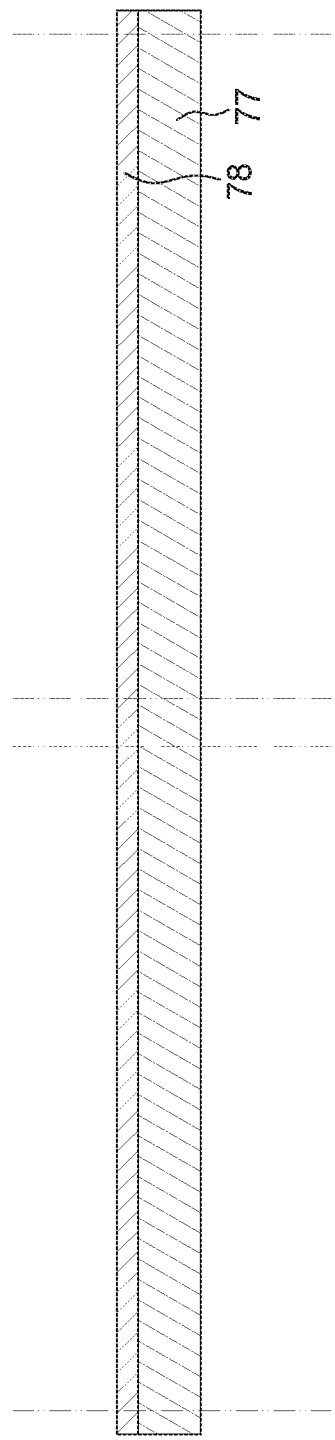
FIG. 9 illustrates one or more stages of an example of a semiconductor process according to some embodiments of the present disclosure.

Referring to FIG. 9, a carrier 77 is provided, and a release film 78 is disposed thereon.

Figure 10:
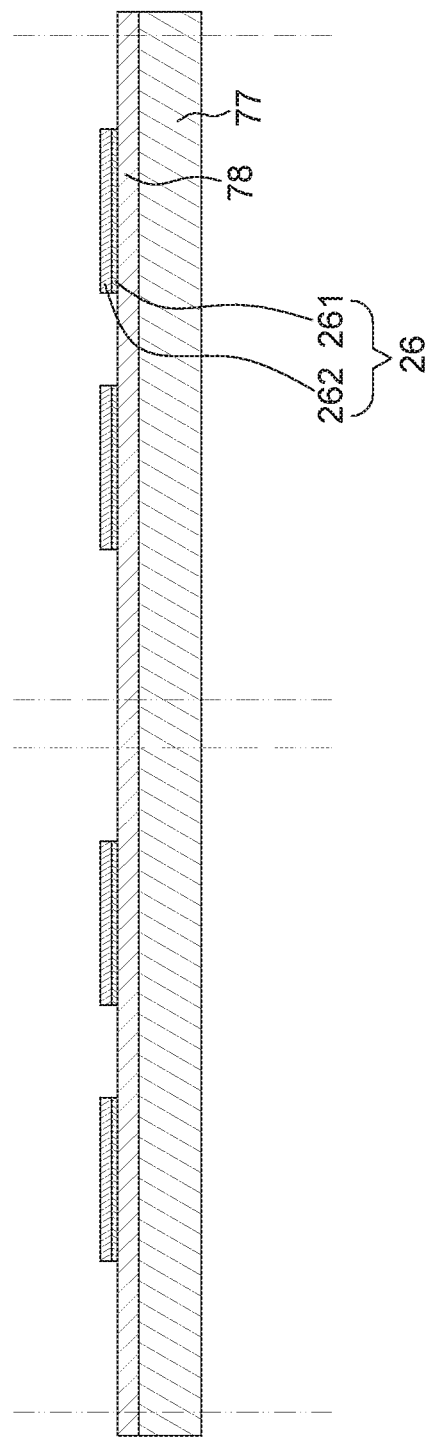
FIG. 10 illustrates one or more stages of an example of a semiconductor process according to some embodiments of the present disclosure.

Referring to FIG. 10, a first circuit layer 26 is formed or disposed on the release film 78. The first circuit layer 26 may include a seed layer 261 and a conductive layer 262 sequentially disposed on the release film 78. In some embodiments, the seed layer 261 may be formed by sputtering, and the conductive layer 262 may be formed by plating in a mask and on the seed layer 261. Then, portions of the seed layer 261 not covered by the conductive layer 262 may be etched.

Figure 11:
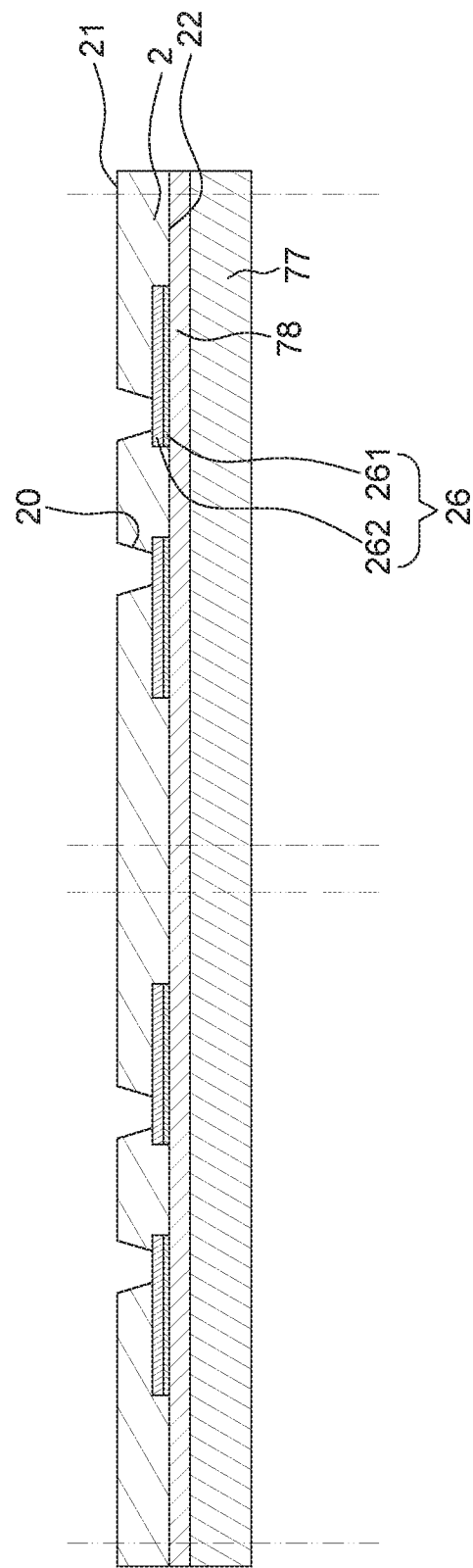
FIG. 11 illustrates one or more stages of an example of a semiconductor process according to some embodiments of the present disclosure.

Referring to FIG. 11, a first insulation layer 2 is formed or disposed on the release film 78 to cover the first circuit layer 26. The first insulation layer 2 has a first surface 21 and a second surface 22 opposite to the first surface 21. As shown in FIG. 11, the first surface 21 may be a top surface, and the second surface 22 may be a bottom surface. Then, an opening 20 is formed on the first insulation layer 2. The opening 20 extends through the first insulation layer 2 to expose a portion of the first circuit layer 26.

Figure 12:
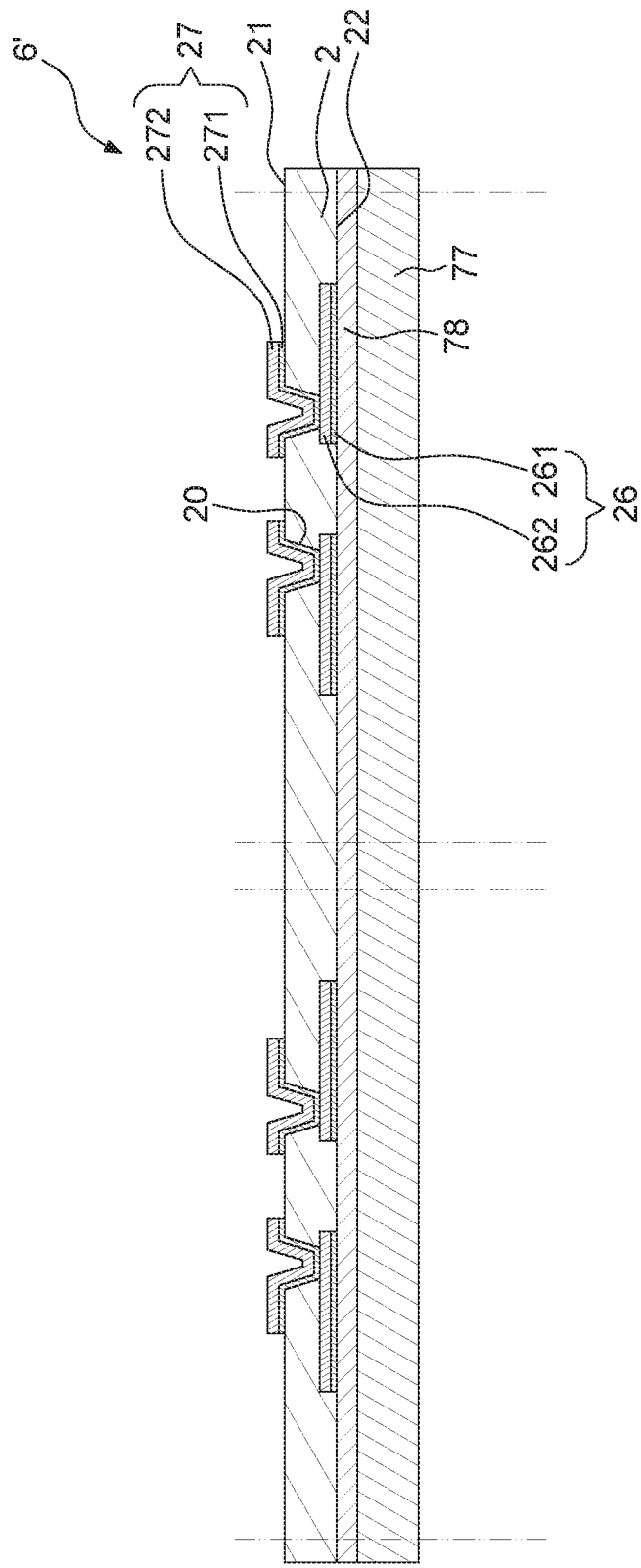
FIG. 12 illustrates one or more stages of an example of a semiconductor process according to some embodiments of the present disclosure.

Referring to FIG. 12, a second circuit layer 27 is formed or disposed on the first surface 21 of the first insulation layer 2, and extends in the opening 20 to connect and electrically connect the first circuit layer 26. The second circuit layer 27 also includes a seed layer 271 and a conductive layer 272. The seed layer 271 is disposed on and contacts the first insulation layer 2, and the conductive layer 272 is disposed on and covers the seed layer 271. Meanwhile, a wiring structure 6' (e.g., including the first insulation layer 2, the first circuit layer 26 and the second circuit layer 27) is obtained.

Figure 13:
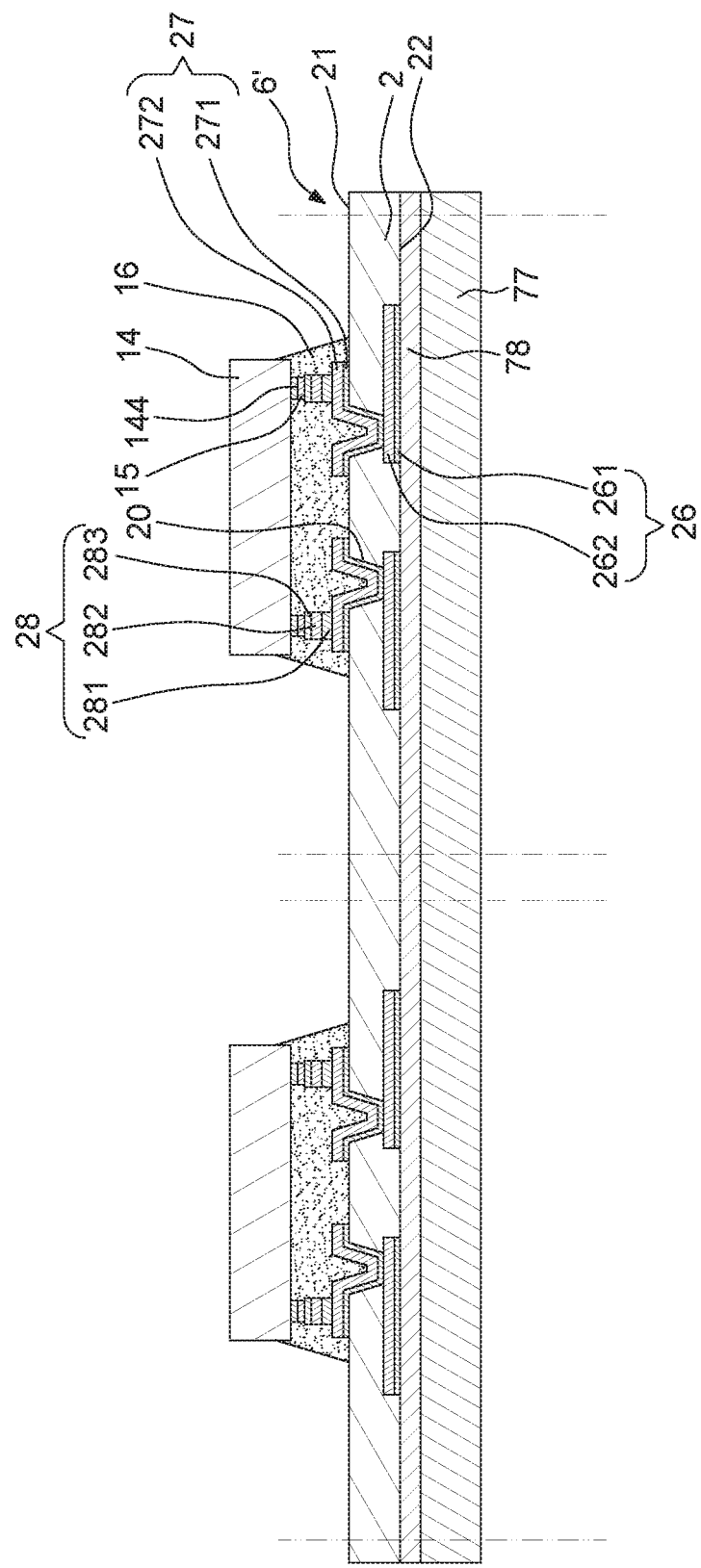
FIG. 13 illustrates one or more stages of an example of a semiconductor process according to some embodiments of the present disclosure.

Referring to FIG. 13, a plurality of conductive pillars 28 are formed on the second circuit layer 27. In some embodiments, each of the conductive pillars 28 includes a first section 281, a second section 282 and a third section 283 sequentially disposed on the second circuit layer 27. The first second 281, the second section 282 and the third section 283 may be made of copper, nickel and gold, respectively. Then, a semiconductor chip 14 is electrically connected to the wiring structure 6'. The semiconductor chip 14 may include a plurality of bumps 144. The bumps 144 are electrically connected to the conductive pillars 28 through a plurality of solders 15. That is, the wiring structure is provided, with the semiconductor chip 14 electrically connected to the wiring structure. Then, an underfill 16 is formed or disposed between the semiconductor chip 14 and the first insulation layer 2 to cover the second circuit layer 27, the conductive pillars 28, the solders 15 and the bumps 144 of the semiconductor chip 14.

Figure 14:
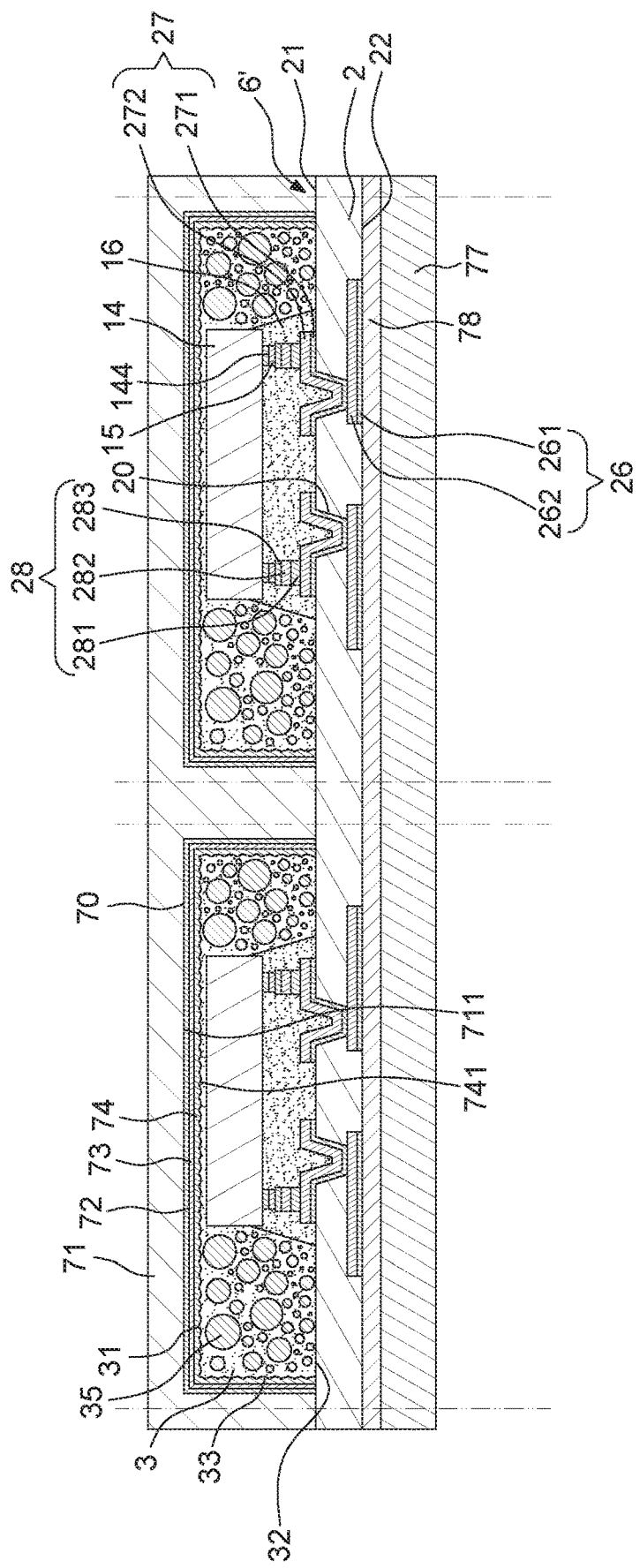
FIG. 14 illustrates one or more stages of an example of a semiconductor process according to some embodiments of the present disclosure.

Referring to FIG. 14, an encapsulant 3 is disposed in the cavity 70 of the mold chase 71 to contact the sacrificial layer 74. The wiring structure (e.g., including the first insulation layer 2, the first circuit layer 26 and the second circuit layer 27) is disposed on the mold chase 71, such that the semiconductor chip 14 is accommodated in the cavity 70 of the mold chase 71 and covered by the encapsulant 3. As shown in FIG. 14, the mold chase 71 is pressed against the first surface 21 of the first insulation layer 2. The encapsulant 3 is disposed on the wiring structure 6' and covers the semiconductor chip 14. The encapsulant 3 has a first surface 31, a second surface 32 opposite to the first surface 31, and a lateral surface 33 extending between the first surface 31 and the second surface 32. The second surface 32 is disposed on and contacts the first surface 21 of the first insulation layer 2. In some embodiments, the encapsulant 3 may be a molding compound, such as an epoxy resin, and may include fillers 35. The first surface 31 and the lateral surface 33 of the encapsulant 3 are conformal to the inner surface 741 of the sacrificial layer 74. Accordingly, a roughness (Ra) of the first surface 31 and the lateral surface 33 of the encapsulant is about 5 nm to about 50 nm.

Figure 15:
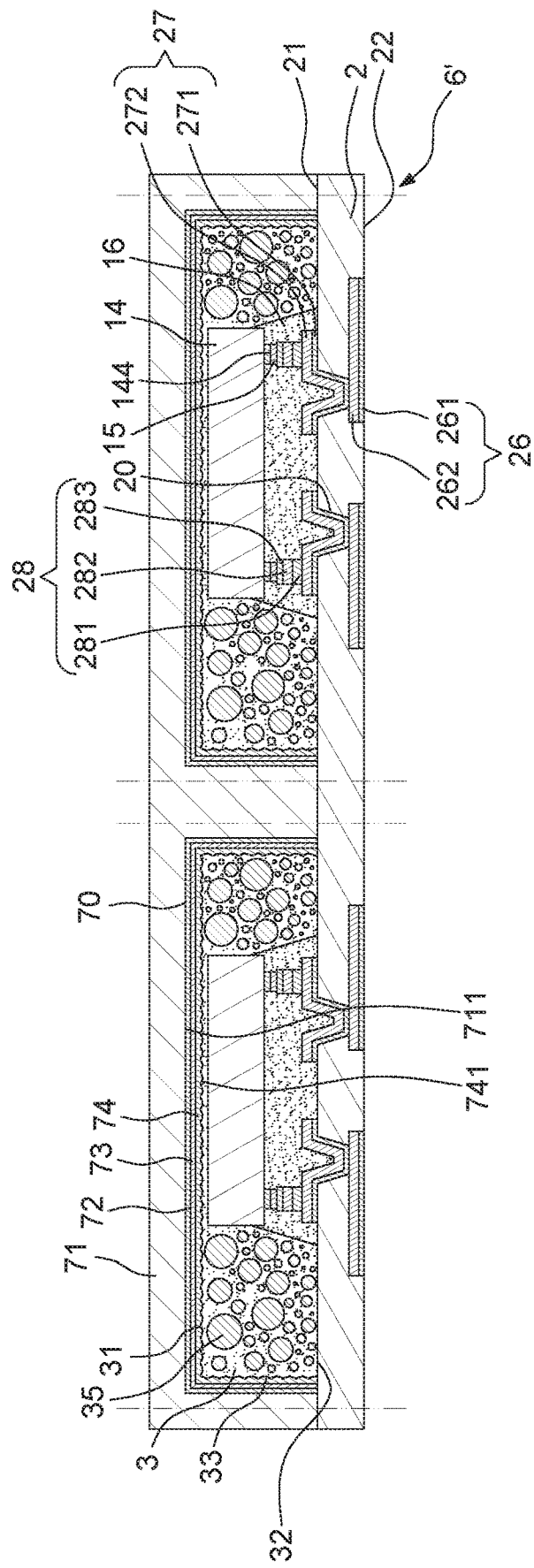
FIG. 15 illustrates one or more stages of an example of a semiconductor process according to some embodiments of the present disclosure.

Referring to FIG. 15, the carrier 77 and the release film 78 are removed, such that the first circuit layer 26 is exposed.

Figure 16:
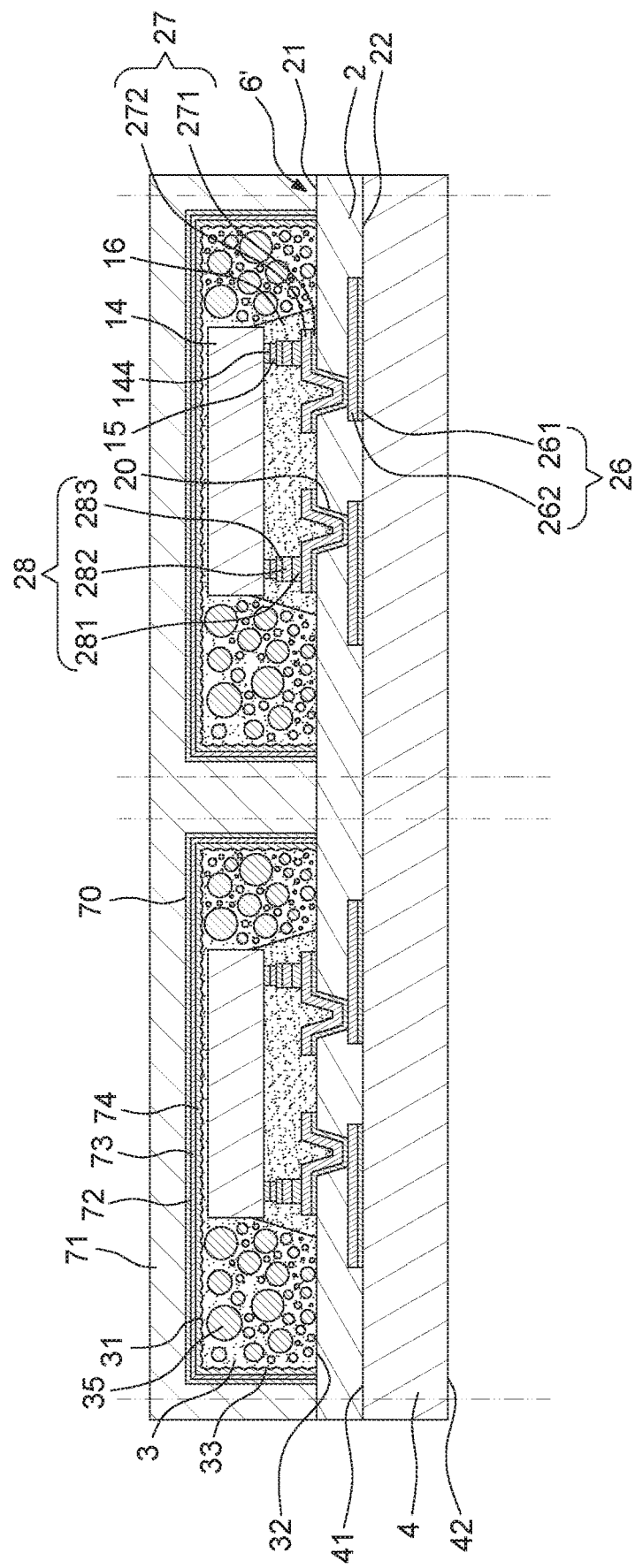
FIG. 16 illustrates one or more stages of an example of a semiconductor process according to some embodiments of the present disclosure.

Referring to FIG. 16, a second insulation layer 4 is formed or disposed on the first insulation layer 2 to cover the first circuit layer 26. For example, the second insulation layer 4 is disposed on and contacts the second surface 22 of the first insulation layer 2. The second insulation layer 4 has a first surface 41 and a second surface 42 opposite to the first surface 41. As shown in FIG. 1, the first surface 41 may be a top surface, and the second surface 42 may be a bottom surface. The first surface 41 of the second insulation layer 4 contacts the second surface 22 of the first insulation layer 2.

Figure 17:
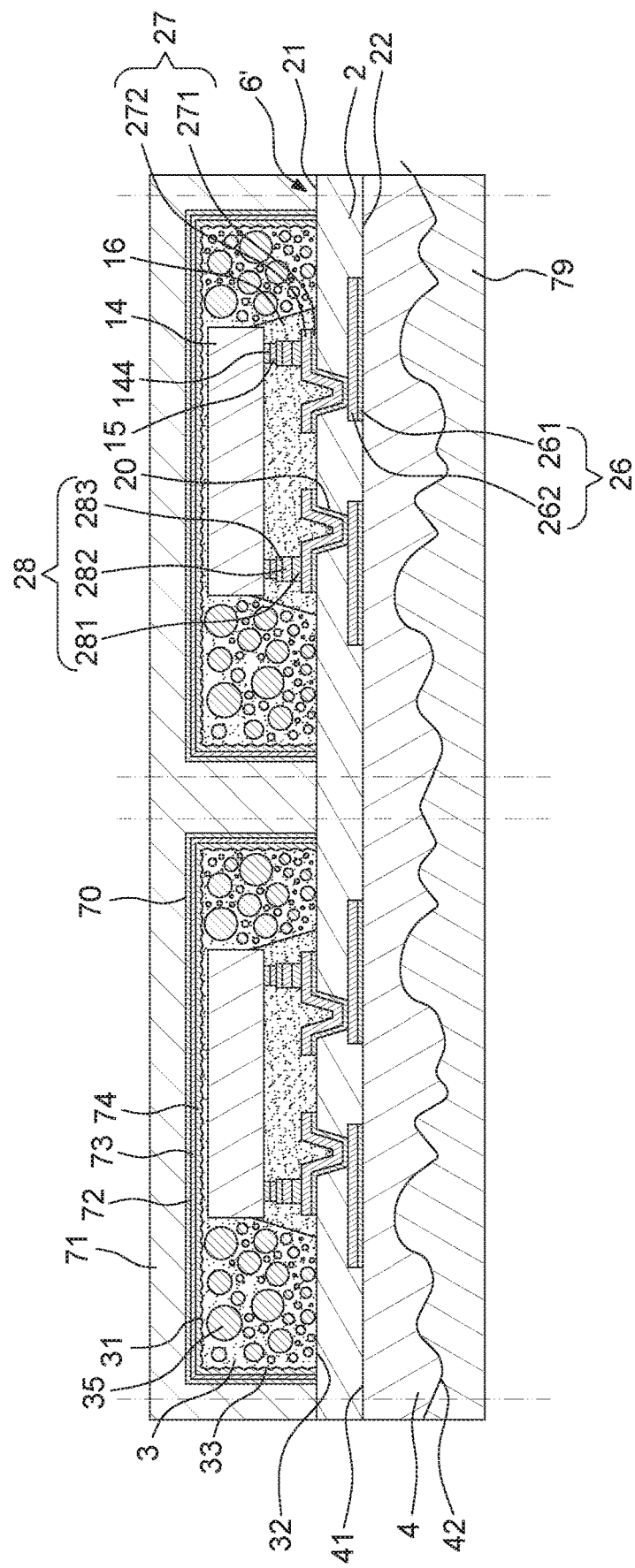
FIG. 17 illustrates one or more stages of an example of a semiconductor process according to some embodiments of the present disclosure.

Referring to FIG. 17, a surface treatment is conducted to roughen the second surface 42 of the second insulation layer 4. For example, the second surface 42 of the second insulation layer 4 is roughened by transfer printing with a mold 79. The mold 79 is provided with a surface roughness (Ra) greater than about 250 nm, and is pressed against the second surface 42 of the second insulation layer 4. Accordingly, the second surface 4 of the second insulation layer 4 is conformal to the mold 79, thus the roughness (Ra) of the second surface 42 of the second insulation layer 4 is greater than about 250 nm.

Figure 18:
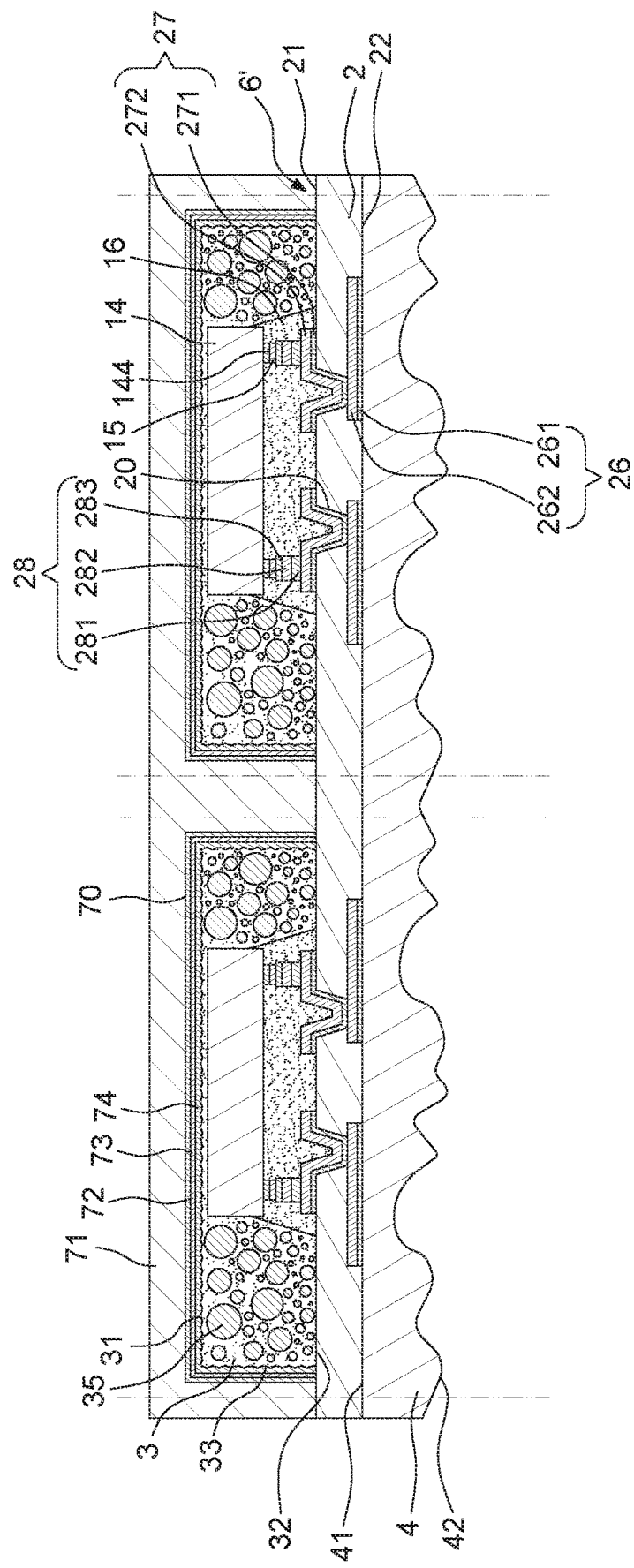
FIG. 18 illustrates one or more stages of an example of a semiconductor process according to some embodiments of the present disclosure.

Referring to FIG. 18, the mold 79 is removed to expose the second surface 42 of the second insulation layer 4.

Figure 19:
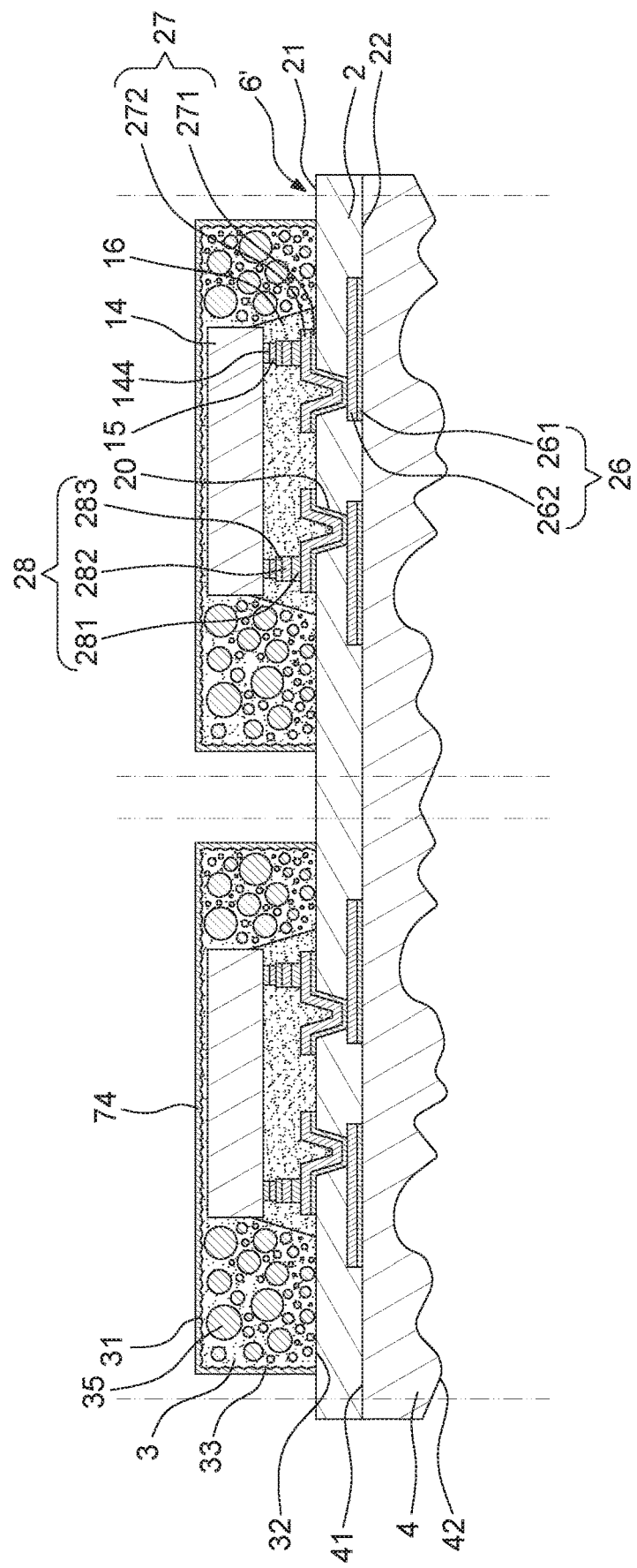
FIG. 19 illustrates one or more stages of an example of a semiconductor process according to some embodiments of the present disclosure.

Referring to FIG. 19, the mold chase 71, the seed layer 72 and the metal layer 73 are removed to expose the sacrificial layer 74. That is, the mold chase 71 and the sacrificial layer 74 are separated.

Figure 20:
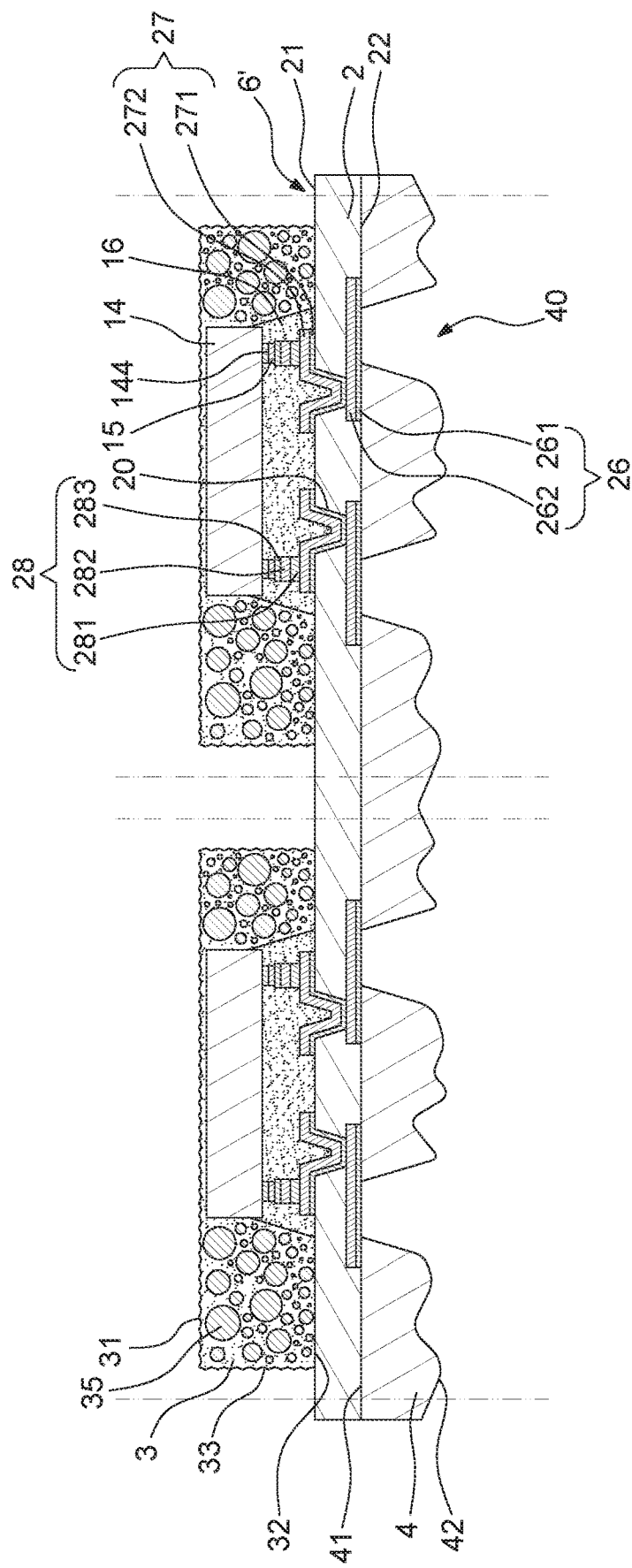
FIG. 20 illustrates one or more stages of an example of a semiconductor process according to some embodiments of the present disclosure.

Referring to FIG. 20, the sacrificial layer 74 is removed to expose the first surface 31 and the lateral surface 33 of the encapsulant 3. In some embodiments, the sacrificial layer 74 on the encapsulant 3 may be removed by etching. For example, if the sacrificial layer 74 is made of graphene or graphene oxide, the sacrificial layer 74 may be removed by dissolving in n-methyl-2-pyrrolidone at a temperature of about 200° C. or greater.

Then, at least one opening 40 is formed on the second insulation layer 4 to expose a portion of the first circuit layer 26. That is, the opening 40 is formed on the roughened surface (e.g., the second surface 42 of the second insulation layer 4) of the wiring structure 6' (e.g., including the first insulation layer 2, the first circuit layer 26, the second circuit layer 27 and the second insulation layer 4).

Figure 21:
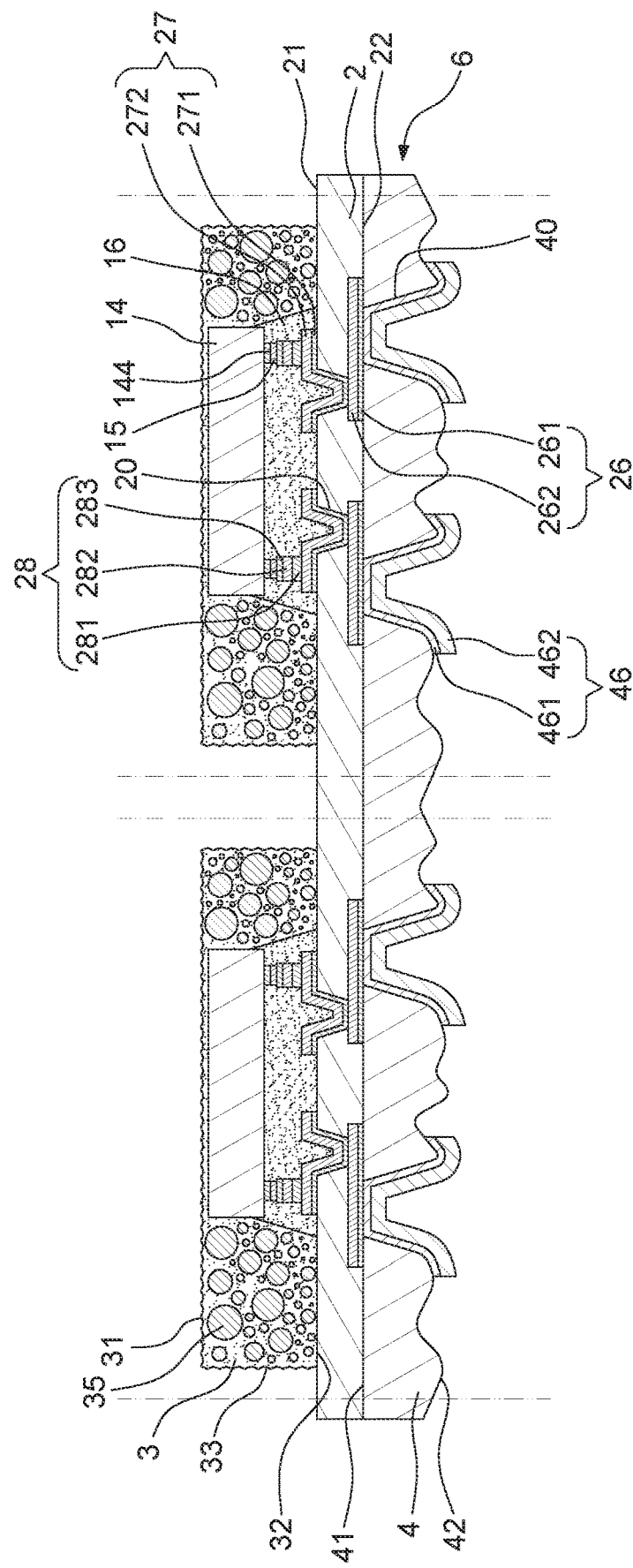
FIG. 21 illustrates one or more stages of an example of a semiconductor process according to some embodiments of the present disclosure.

Referring to FIG. 21, at least one under bump metallization (UBM) 46 is formed on the second surface 42 of the second insulation layer 4, and in the opening 40 of the second insulation layer 4 to contact and electrically connect the first circuit layer 26. A portion of the UBM 46 extends on and is conformal to the second surface 42 of the second insulation layer 4. In some embodiments, the UBM 46 also includes a seed layer 461 and a conductive layer 462. The seed layer 461 is disposed on and contacts the second insulation layer 4, and the conductive layer 462 is disposed on and covers the seed layer 461. Meanwhile, a wiring structure 6 (e.g., including the first insulation layer 2, the first circuit layer 26, the second circuit layer 27, the second insulation layer 4 and the UBM 46) is obtained.

Figure 22:
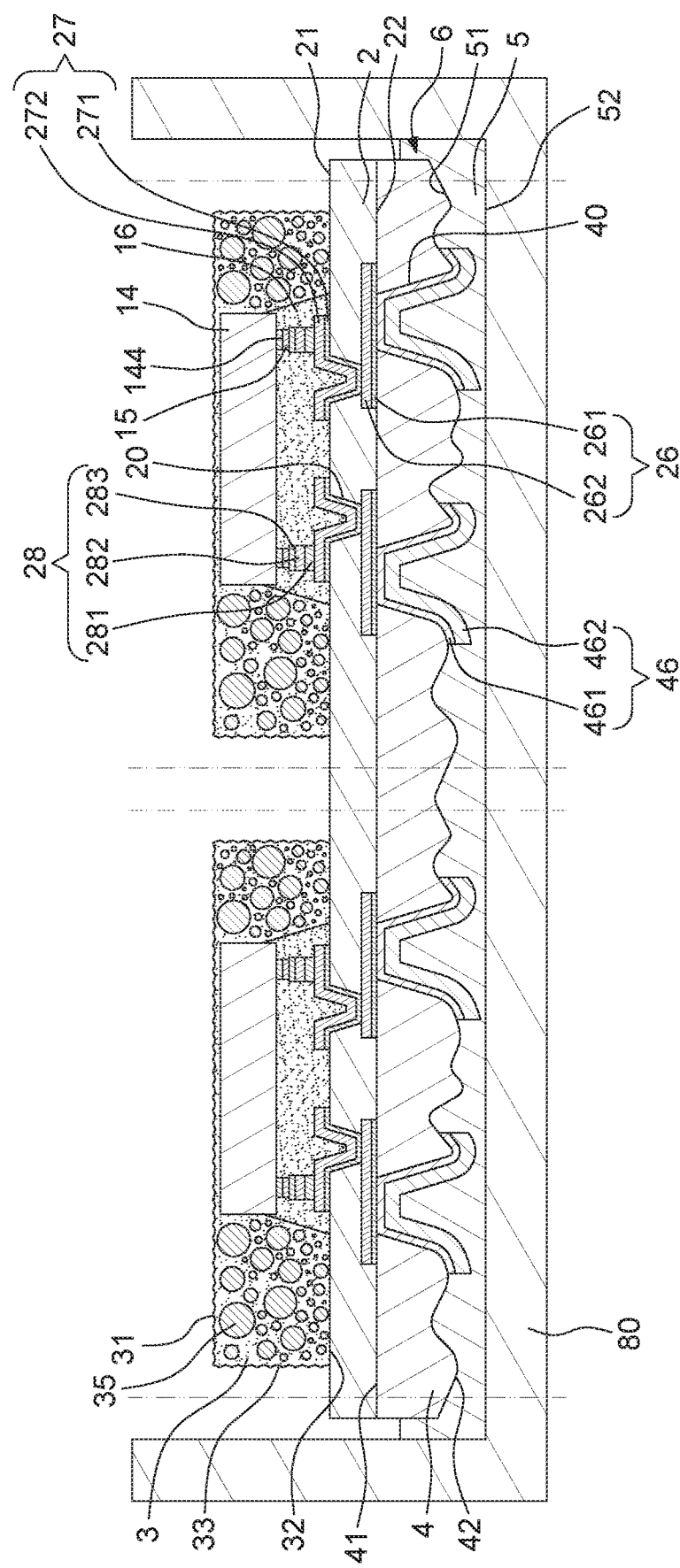
FIG. 22 illustrates one or more stages of an example of a semiconductor process according to some embodiments of the present disclosure.

Referring to FIG. 22, the wiring structure 6 is dipped into a hydrophobic material 5 in a tank 80. The hydrophobic material 5 is thus adhered to a bottom surface of the wiring structure 6, such as the second surface 42 of the second insulation layer 4, to form a hydrophobic layer 5. The hydrophobic layer 5 is formed on the roughened surface (e.g., the second surface 42 of the second insulation layer 4) to cover the under bump metallization 46. The hydrophobic layer 5 has a first surface 51 and a second surface 52 opposite to the first surface 51. As shown in FIG. 22, the first surface 51 may be a top surface, and the second surface 52 may be a bottom surface. The first surface 51 of the hydrophobic layer 5 contacts and is conformal to the bottom surface 42 of the second insulation layer 4.

Figure 23:
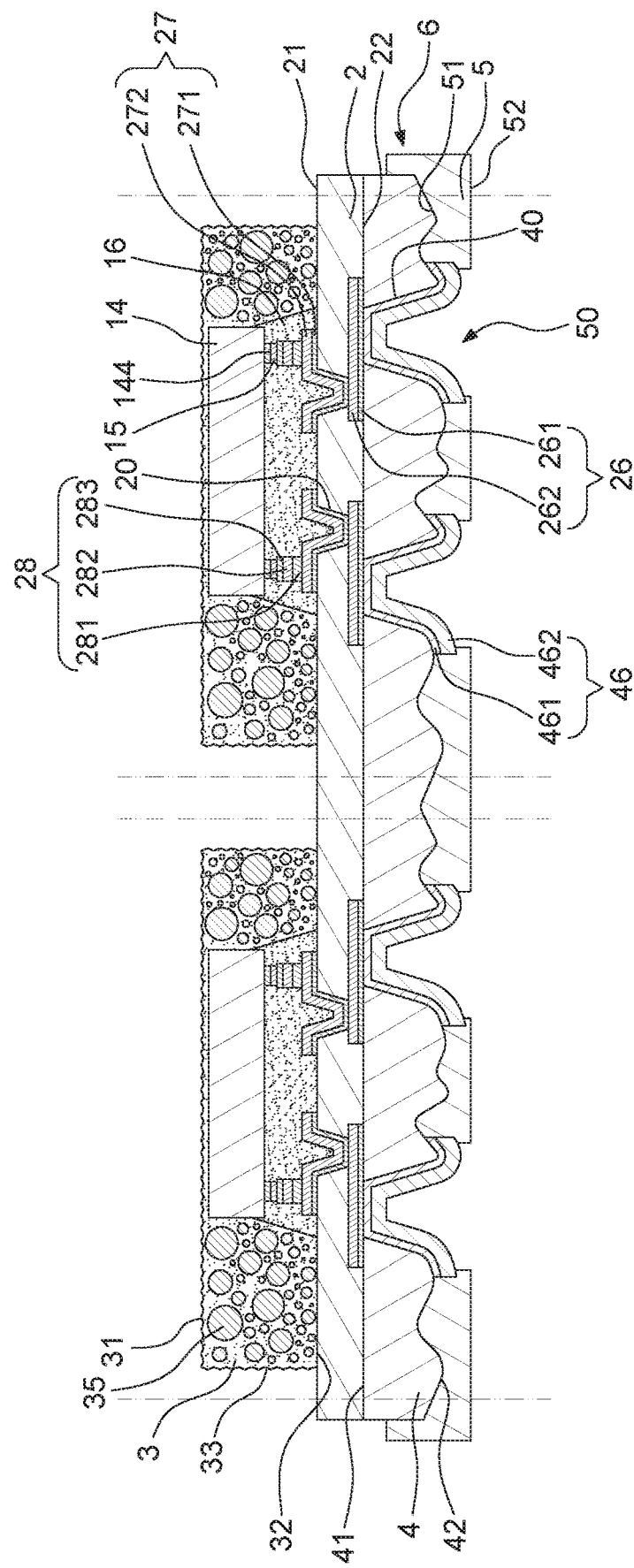
FIG. 23 illustrates one or more stages of an example of a semiconductor process according to some embodiments of the present disclosure.

Referring to FIG. 23, at least one opening 50 is formed on the hydrophobic layer 5 to expose the UBM 46 by, for example, laser drilling. Then, a connecting element 17 is formed in the opening 50 of the hydrophobic layer 5 and on the UBM 46. Then, a singulation process is conduced to the first insulation layer 2, the second insulation layer 4 and the hydrophobic layer 5, thus forming the semiconductor package device 1 as shown in FIG. 1.

Figure 24:
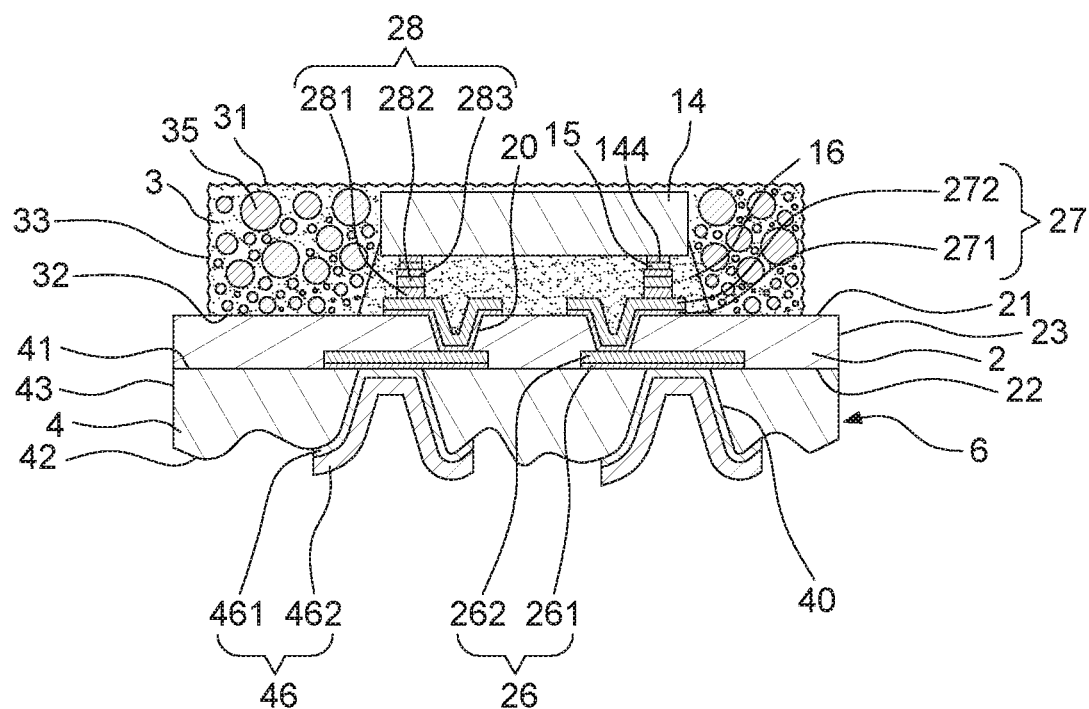
FIG. 24 illustrates one or more stages of an example of a semiconductor process according to some embodiments of the present disclosure.
Figure 25:
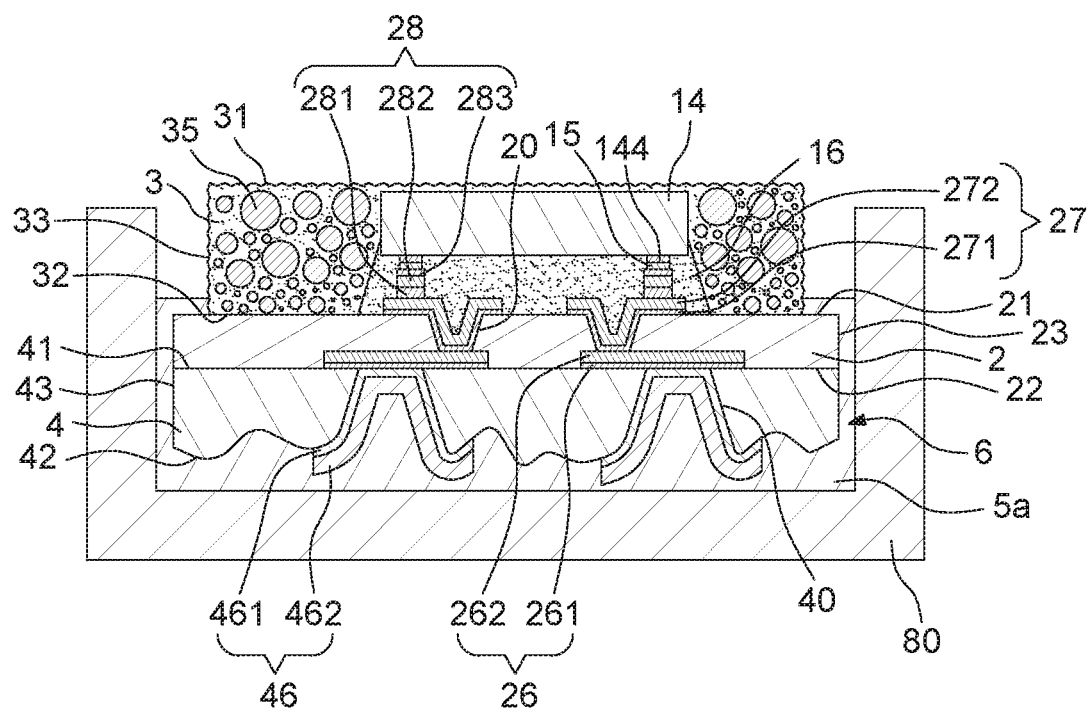
FIG. 25 illustrates one or more stages of an example of a semiconductor process according to some embodiments of the present disclosure.

FIG. 24 through FIG. 25 illustrate a semiconductor process according to some embodiments of the present disclosure. In some embodiments, the semiconductor process is for manufacturing a semiconductor package device such as the semiconductor package device 1a shown in FIG. 2. The initial stages of the illustrated process are the same as, or similar to, the stages illustrated in FIG. 5 through FIG. 21. FIG. 24 depicts a stage subsequent to that depicted in FIG. 21.

Referring to FIG. 24, a singulation process is conduced to the wiring structure 6 (e.g., including the first insulation layer 2 and the second insulation layer 4). The first insulation layer 2 thus has a lateral surface 23 substantially coplanar with a lateral surface 43 of the second insulation layer 4.

Referring to FIG. 25, the wiring structure 6 (e.g., including the first insulation layer 2, the first circuit layer 26, the second circuit layer 27, the second insulation layer 4 and the UBM 46) is dipped into a hydrophobic material 5a in a tank 80. The hydrophobic material 5a is thus adhered to a bottom surface, a lateral surface and a top surface of the wiring structure 6, such as the second surface 42, the lateral surface 43 of the second insulation layer 4, and the lateral surface 23 and the first surface 21 of the first insulation layer 2, to form a hydrophobic layer 5a. Then, at least one opening 50 is formed on the hydrophobic layer 5a to expose the UBM 46. Then, a connecting element 17 is formed in the opening 50 of the hydrophobic layer 5a and on the UBM 46, thus forming the semiconductor package device 1a as shown in FIG. 2.

Figure 26:
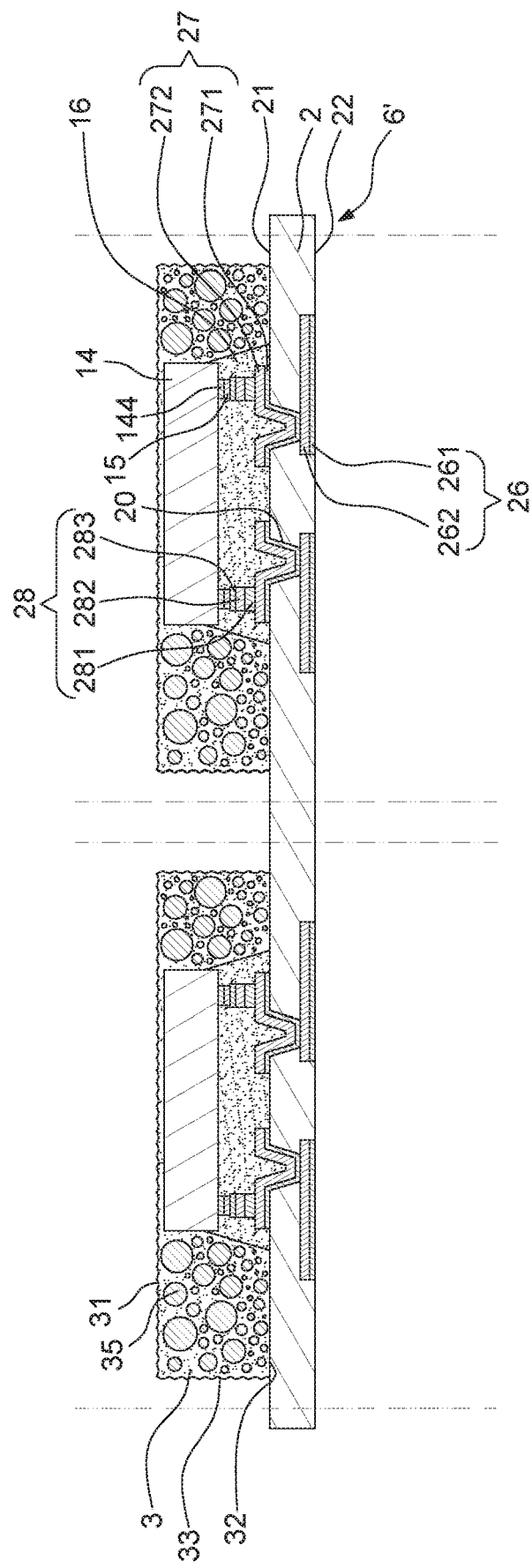
FIG. 26 illustrates one or more stages of an example of a semiconductor process according to some embodiments of the present disclosure.
Figure 27:
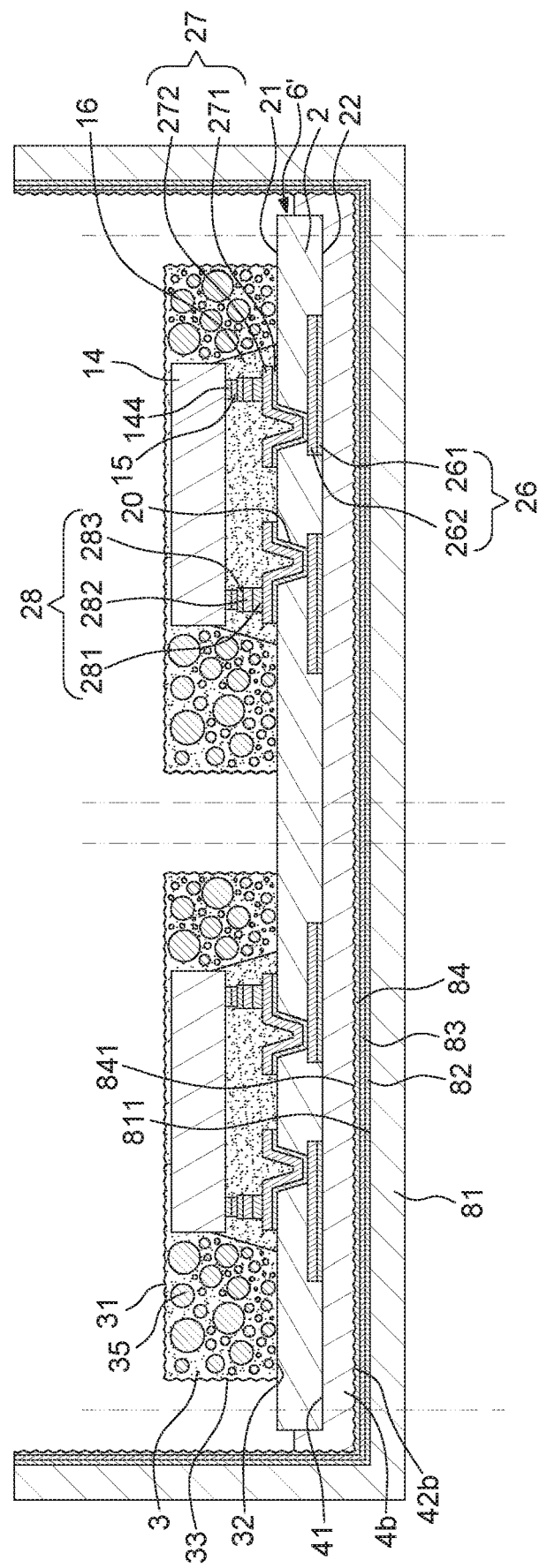
FIG. 27 illustrates one or more stages of an example of a semiconductor process according to some embodiments of the present disclosure.
Figure 28:
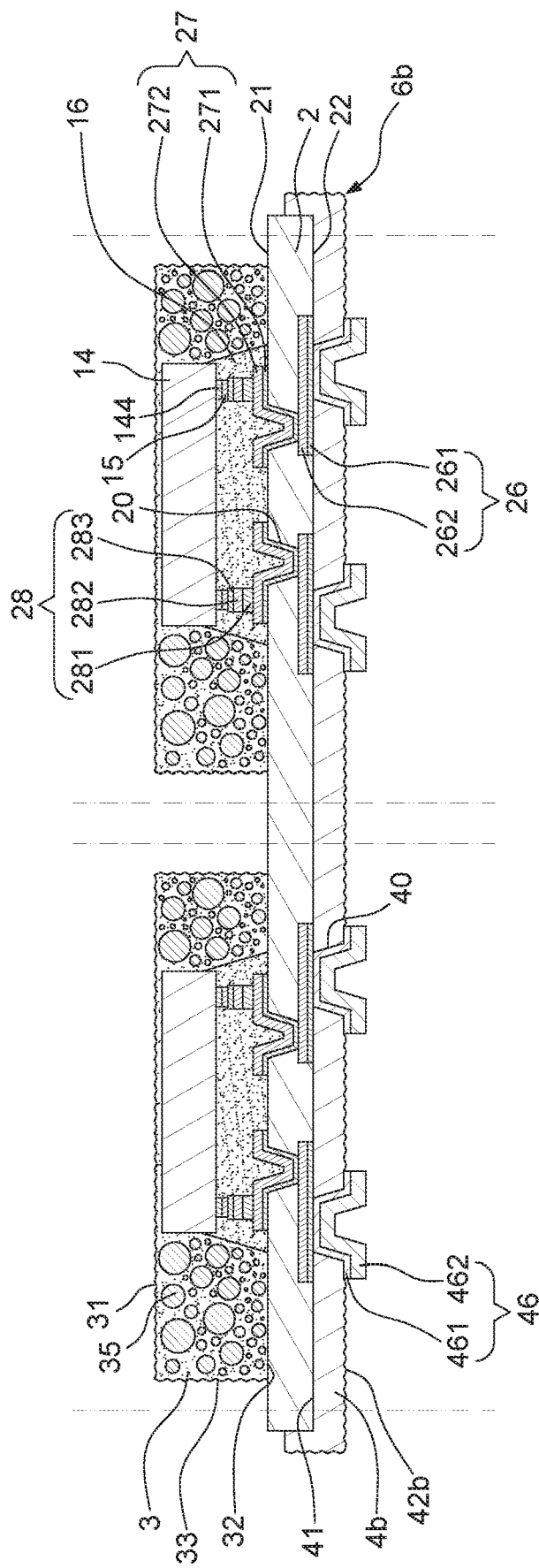
FIG. 28 illustrates one or more stages of an example of a semiconductor process according to some embodiments of the present disclosure.

FIG. 26 through FIG. 28 illustrate a semiconductor process according to some embodiments of the present disclosure. In some embodiments, the semiconductor process is for manufacturing a semiconductor package device such as the semiconductor package device 1b shown in FIG. 3. The initial stages of the illustrated process are the same as, or similar to, the stages illustrated in FIG. 5 through FIG. 14. FIG. 26 depicts a stage subsequent to that depicted in FIG. 14.

Referring to FIG. 26, the mold chase 71, the seed layer 72, the metal layer 73 and the sacrificial layer 74 are removed as described above. The carrier 77 and the release film 78 are also removed.

Referring to FIG. 27, a tank 81 is provided. A seed layer 82, a metal layer 83 and a sacrificial layer 84 are sequentially disposed on an inner surface 811 of the tank 81. A roughness (Ra) of an inner surface 841 of the sacrificial layer 84 may be about 5 nm to 50 nm. The formation and materials of the tank 81, the seed layer 82, the metal layer 83 and the sacrificial layer 84 may be similar to those of the mold chase 71, the seed layer 72, the metal layer 73 and the sacrificial layer 74, thus are not described redundantly here. The wiring structure 6' (e.g., including the first insulation layer 2, the first circuit layer 26 and the second circuit layer 27) is dipped into an insulation material 4b in the tank 81. The insulation material 4b is thus adhered to the bottom surface of the wiring structure 6', such as the second surface 22 of the first insulation layer 2, to form a second insulation layer 4b.

The second insulation layer 4b has a first surface 41 and a second surface 42b opposite to the first surface 41. The second surface 42b of the second insulation layer 42 is conformal to the inner surface 841 of the sacrificial layer 84. Accordingly, a roughness (Ra) of the second surface 42b of the second insulation layer 4b may be about 5 nm to 50 nm.

Referring to FIG. 28, the tank 81, the seed layer 82, the metal layer 83 and the sacrificial layer 84 are removed. Then, at least one opening 40 is formed on the second insulation layer 4b to expose a portion of the first circuit layer 26. Then, an UBM 46 is formed in the opening 40 of the second insulation layer 4b to contact and electrically connect the first circuit layer 26. Then, a connecting element 17 is formed on the UBM 46. Then, a singulation process is conducted to the first insulation layer 2 and the second insulation layer 4b, thus forming the semiconductor package device 1b as shown in FIG. 3.

Figure 29:
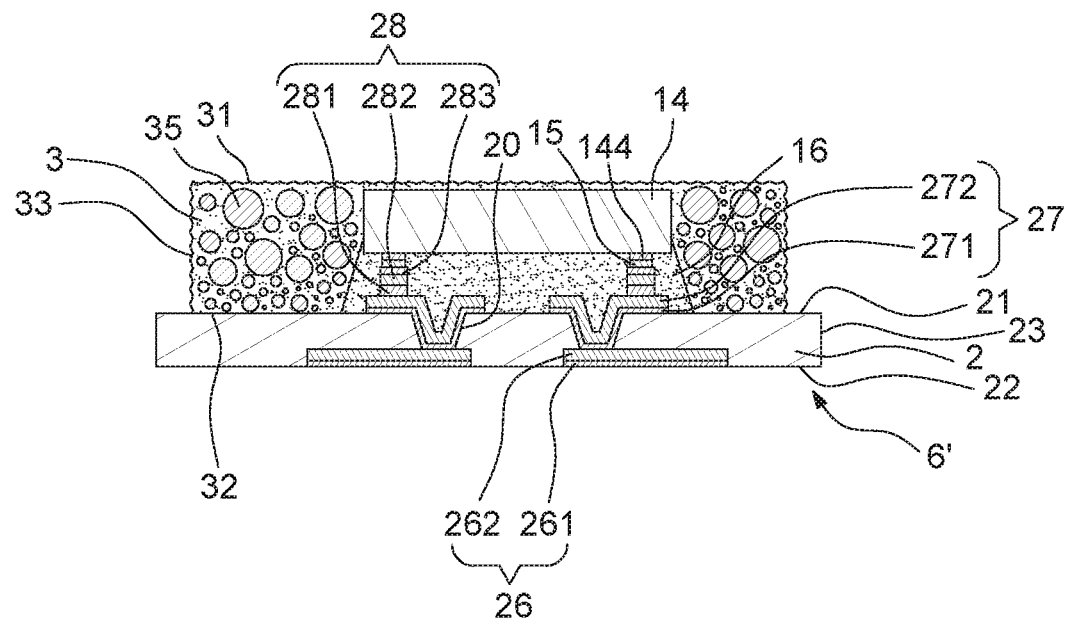
FIG. 29 illustrates one or more stages of an example of a semiconductor process according to some embodiments of the present disclosure.
Figure 30:
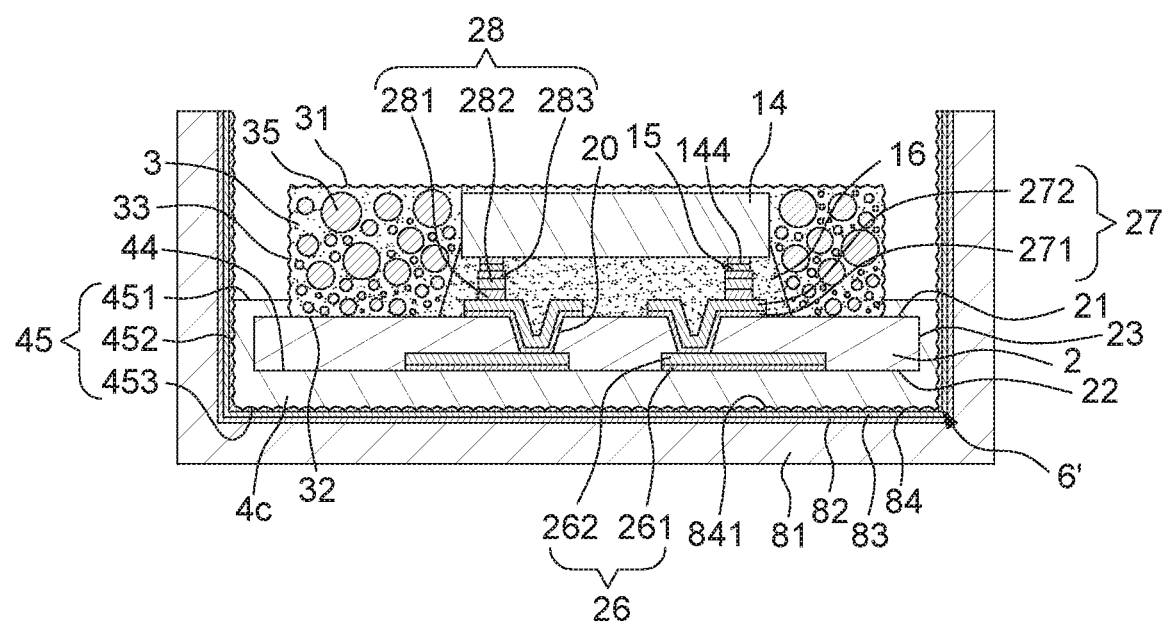
FIG. 30 illustrates one or more stages of an example of a semiconductor process according to some embodiments of the present disclosure.

FIG. 29 through FIG. 30 illustrate a semiconductor process according to some embodiments of the present disclosure. In some embodiments, the semiconductor process is for manufacturing a semiconductor package device such as the semiconductor package device 1c shown in FIG. 4. The initial stages of the illustrated process are the same as, or similar to, the stages illustrated in FIG. 5 through FIG. 14 and FIG. 26. FIG. 29 depicts a stage subsequent to that depicted in FIG. 26.

Referring to FIG. 29, a singulation process is conduced to the wiring structure 6'. The first insulation layer 2 thus has a lateral surface 23.

Referring to FIG. 30, the wiring structure 6' (e.g., including the first insulation layer 2, the first circuit layer 26 and the second circuit layer 27) is dipped into an insulation material 4c in the tank 81. The insulation material 4c is thus adhered to a bottom surface, a lateral surface and a top surface of the wiring structure 6', such as the second surface 22, the lateral surface 23 and the first surface 21 of the first insulation layer 2, to form a second insulation layer 4c.

The second insulation layer 4c has an inner surface 44 and an outer surface 45. The inner surface 44 is disposed on and contacts the second surface 22, the lateral surface 23 and the first surface 21 of the first insulation layer 2. The outer surface 45 is exposed to air, and has an upper portion 451, a lateral portion 452 and a lower portion 453. The upper portion 451, the lateral portion 452 and the lower portion 453 of the outer surface 45 of the second insulation layer 4b can be viewed as a top surface, a lateral surface and a bottom surface of the second insulation layer 4c, respectively. The lateral portion 452 and the lower portion 453 of the outer surface 45 of the second insulation layer 4b contact and are conformal to the inner surface 841 of the sacrificial layer 84. Accordingly, a roughness (Ra) of the lateral portion 452 and the lower portion 453 of the outer surface 45 of the second insulation layer 4b is about 5 nm to about 50 nm. That is, a roughness (Ra) of a lateral surface and a bottom surface of the wiring structure 6c is about 5 nm to about 50 nm. However, a roughness (Ra) of a top surface of the wirings structure 6c, e.g., the upper portion 451 of the outer surface 45 of the second insulation layer 4b, may not be about 5 nm to about 50 nm.

Then, at least one opening 40 is formed on the second insulation layer 4c to expose a portion of the first circuit layer 26. An UBM 46 is then formed in the opening 40 of the second insulation layer 4c to contact and electrically connect the first circuit layer 26. A connecting element 17 is then formed on the UBM 46, thus forming the semiconductor package device 1c as shown in FIG. 4.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package device, comprising:
    a wiring structure including a first insulation layer, a circuit layer in contact with the first insulation layer, and a second insulation layer disposed on the first insulation layer and covering the circuit layer;
    a semiconductor chip electrically connected to the wiring structure; and
    an encapsulant disposed on the wiring structure and covering the semiconductor chip, wherein a roughness (Ra) of a surface of the encapsulant is about 5 nm to about 50 nm.

2. The semiconductor package device of claim 1, further comprising a hydrophobic layer disposed on a bottom surface of the second insulation layer.

3. The semiconductor package device of claim 2, wherein a roughness (Ra) of a bottom surface of the hydrophobic layer is less than a roughness (Ra) of the bottom surface of the second insulation layer.

4. The semiconductor package device of claim 1, further comprising a hydrophobic layer disposed on a bottom surface of the wiring structure.

5. The semiconductor package device of claim 4, wherein a water contact angle of the hydrophobic layer is about 150° to about 180°.

6. The semiconductor package device of claim 4, wherein the hydrophobic layer is further disposed on a lateral surface of the wiring structure.

7. The semiconductor package device of claim 6, wherein the hydrophobic layer is further disposed on a top surface of the wiring structure.

8. The semiconductor package device of claim 2, wherein the wiring structure includes an under bump metallization disposed adjacent to a bottom surface thereof, and the hydrophobic layer covers at least a portion of the under bump metallization.

9. The semiconductor package device of claim 8, wherein the hydrophobic layer defines an opening to expose the under bump metallization, and a connecting element is disposed in the opening and on the under bump metallization.

10. The semiconductor package device of claim 1, wherein a roughness (Ra) of a bottom surface of the second insulation layer is about 5 nm to about 50 nm.

11. The semiconductor package device of claim 10, wherein the second insulation layer is disposed on a bottom surface and a lateral surface of the first insulation layer.

12. The semiconductor package device of claim 11, wherein the second insulation layer is further disposed on a top surface of the first insulation layer, and contacts the encapsulant.

13. A semiconductor package device, comprising:
    a wiring structure;
    a semiconductor chip electrically connected to the wiring structure; and
    a hydrophobic layer disposed on a bottom surface of the wiring structure.

14. The semiconductor package device of claim 13, wherein the wiring structure includes a first insulation layer, a circuit layer in contact with the first insulation layer, and a second insulation layer disposed on the first insulation layer and covering the circuit layer;
    wherein the hydrophobic layer is disposed on a bottom surface of the second insulation layer.

15. The semiconductor package device of claim 13, wherein a water contact angle of the hydrophobic layer is about 150° to about 180°.

16. The semiconductor package device of claim 13, further comprising an under bump metallization disposed in the wiring structure, wherein the hydrophobic layer covers at least a portion of the under bump metallization.

17. The semiconductor package device of claim 16, wherein the hydrophobic layer defines an opening to expose the under bump metallization, and a connecting element is disposed in the opening and on the under bump metallization.

18. A semiconductor process, comprising:
    (a) providing a mold chase having an inner surface defining a cavity;

(b) disposing a sacrificial layer on the inner surface of the mold chase, wherein a roughness (Ra) of the sacrificial layer is about 5 nm to about 50 nm;
(c) disposing an encapsulant in the cavity of the mold chase to contact the sacrificial layer;
(d) providing a wiring structure with a semiconductor chip electrically connected thereon;
(e) disposing the wiring structure on the mold chase, such that the semiconductor chip is accommodated in the cavity of the mold chase and covered by the encapsulant; and
(f) removing the mold chase and the sacrificial layer.

19. The process of claim 18, wherein in (b), the sacrificial layer is a layer of graphene, graphene oxide, copper, copper oxide or zinc oxide formed by physical vapor deposition.

20. The process of claim 18, wherein after (e), the method further comprises:
(e1) roughening a surface of the wiring structure.

21. The process of claim 18, wherein after (f), the method further comprises:
(g) forming an opening on the roughened surface of the wiring structure;
(h) forming an under bump metallization in the opening; and
(i) forming a hydrophobic layer on the roughened surface to cover the under bump metallization.

22. The process of claim 18, wherein (f) comprises:
(f1) separating the mold chase and the sacrificial layer; and
(f2) removing the sacrificial layer on the encapsulant by etching.

* * * * *